(12) United States Patent
Won et al.

(10) Patent No.: US 10,559,526 B2
(45) Date of Patent: Feb. 11, 2020

(54) ELECTRO-LUMINESCENCE DISPLAY DEVICE AND DRIVER IC FILM UNIT FOR ELECTRO-LUMINESCENCE DISPLAY DEVICE

(71) Applicant: LG Display Co., Ltd., Seoul (KR)

(72) Inventors: Jooyeon Won, Goyang-si (KR); ChangHo An, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/131,492

(22) Filed: Sep. 14, 2018

(65) Prior Publication Data

US 2019/0088584 A1 Mar. 21, 2019

(30) Foreign Application Priority Data

Sep. 15, 2017 (KR) ........................ 10-2017-0118348

(51) Int. Cl.
*H01L 23/48* (2006.01)
*H01L 23/52* (2006.01)
(Continued)

(52) U.S. Cl.
CPC .... *H01L 23/49838* (2013.01); *H01L 21/4803* (2013.01); *H01L 22/22* (2013.01); *H01L 23/4985* (2013.01); *H01L 23/49833* (2013.01); *H01L 24/32* (2013.01); *H01L 27/124* (2013.01); *H01L 2224/32227* (2013.01); *H01L 2924/1426* (2013.01)

(58) Field of Classification Search
USPC .......................... 257/88, 664–665, 734–786, 257/E29.111–E29.165, E23.01–E23.079, 257/E23.141–E23.179; 438/571, 597, 438/666
See application file for complete search history.

(56) References Cited

U.S. PATENT DOCUMENTS

| 2010/0237892 | A1  | 9/2010 | Ueno |              |
|--------------|-----|--------|------|--------------|
| 2013/0175528 | A1* | 7/2013 | Han  | H01L 22/32   |
|              |     |        |      | 257/48       |
| 2013/0186680 | A1* | 7/2013 | Ha   | H05K 1/115   |
|              |     |        |      | 174/265      |

FOREIGN PATENT DOCUMENTS

| EP | 2 927 702 A1    | 10/2015 |
| JP | 2015-172530 A   | 10/2015 |
| KR | 10-2010-0000732 A | 1/2010 |

OTHER PUBLICATIONS

European Patent Office, Extended European Search Report and Opinion, EP Patent Application No. 18191472.2, dated Feb. 12, 2019, nine pages.

* cited by examiner

*Primary Examiner* — Niki H Nguyen
(74) *Attorney, Agent, or Firm* — Fenwick & West LLP

(57) ABSTRACT

A driver IC film unit including a flexible film, a driver IC on a first surface of the flexible film and configured to receive an input signal and convert the input signal into an image signal for a display panel, at least first to third pad units, on the first surface of the flexible film, configured to electrically connect the driver IC and the flexible film, and at least first to third wire units, on the first surface of the flexible film, electrically connected to the at least first to third pad units, wherein at least one wire unit among the at least first to third wire units is configured to be extended to a second surface facing the first surface via a first via hole passing through the flexible film, and is configured to include a cut portion of wire corresponding to an edge of the flexible film.

15 Claims, 12 Drawing Sheets

(51) Int. Cl.
 *H01L 29/40* (2006.01)
 *H01L 23/498* (2006.01)
 *H01L 21/66* (2006.01)
 *H01L 27/12* (2006.01)
 *H01L 23/00* (2006.01)
 *H01L 21/48* (2006.01)

ELECTRO-LUMINESCENCE DISPLAY DEVICE AND DRIVER IC FILM UNIT FOR ELECTRO-LUMINESCENCE DISPLAY DEVICE

CROSS-REFERENCE TO RELATED APPLICATIONS

This application claims priority to Republic of Korea Patent Application No. 10-2017-0118348 filed on Sep. 15, 2017 with the Korean Intellectual Property Office, which is hereby incorporated by reference in its entirety.

BACKGROUND

Field of Technology

The present disclosure relates to an electro-luminescence display device and more particularly to an electro-luminescence display device in which a driver integrated circuit (IC) film unit is bonded to a display panel.

Discussion of the Related Art

A display device refers to a device that receives an image signal and displays an image. As typical display devices, liquid crystal display devices and electro-luminescence display devices have been applied to various fields.

As an example, an electro-luminescence display device that is a self-emissive display device includes an electro-luminescence diode (ELD).

An electro-luminescence diode (ELD) includes an anode electrode and a cathode electrode, and an electro-luminescence element disposed therebetween. The electro-luminescence diode may be realized as an organic light emitting diode, an inorganic light emitting diode, an organic/inorganic light emitting diode, and the like. As the inorganic luminescence material, an inorganic luminescence material such as a quantum-dot material or the like may be used.

The electro-luminescence element includes a hole transport layer (HTL), an emission layer (EML), and an electron transport layer (ETL). If a potential difference is generated between the anode electrode and the cathode electrode, holes passing through the HTL and electrons pass through the ETL move to the EML including the light emitting material, thereby forming an exciton. As a result, the light emitting layer (EML) generates visible light. An active matrix type electro-luminescence display device includes an electro-luminescence element that emits light by itself, and has been widely used because of its high response speed, light emitting efficiency, brightness, and viewing angle.

The electro-luminescence display device is arranged with pixels including an electro-luminescence diode (ELD) in a matrix form and displays an image with pixels according to gray level of an image signal, that is, a video data. The electro-luminescence display device receives an image signal transmitted from the outside through a flexible film on which a driver IC is mounted, and transmits the received image signal to pixels.

An electro-luminescence display device includes a display panel for displaying an image, a printed circuit board for driving the display panel, and a driver IC film unit in which a driver IC is mounted on a flexible film for electrically connecting the display panel and the printed circuit board.

Methods of mounting a driver IC on a flexible film may be, for example, a chip on film (COF) or a tape carrier package (TCP) method.

In recent years, electro-luminescence devices, thin film transistors, wires, and the like can be formed on a substrate made of a material having flexibility such as plastic and the like. Accordingly, it is possible to display an image when the electro-luminescence display device is bent. In addition, the electro-luminescence display is developed to achieve lightweight, thin, narrow bezel, high resolution, and high pixels per inch (ppi). As a result, data is increased and the number of signal wires to be processed in the driver IC film unit is increasing.

SUMMARY

A structure and a manufacturing method of an electro-luminescence display device capable of providing a superior display image is disclosed.

A driver IC film unit applied to an electro-luminescence display device with increased display resolution and pixel density is disclosed.

The present disclosure recognizes that as the resolution of the electro-luminescence display increases, the pad area, i.e., size, is increased as the number of pads required for the driver IC film unit increases. For example, a typical resolution of a currently used electro-luminescence display device is QHD (2960×1440) or more, and a general pixels per inch (ppi) is 400 ppi or more. The ppi may be referred to as a pixel density.

The present disclosure recognizes that as the ppi of the electro-luminescence display device increases, the wire intervals of the gate wires and the data wires for supplying signals to the pixels become narrower and the manufacturing process difficulty of the electro-luminescence display device increases accordingly.

Further, the present disclosure recognizes that when a resolution and a pixel density of an electro-luminescence display device is increased, the manufacturing difficulty and the manufacturing cost of a driver IC film unit, configured to supply an image signal and various control signals to an electro-luminescence display device implemented with high resolution and high pixel density, can be increased.

Specifically, the present disclosure recognizes that, in a driver IC film unit capable of supplying an image signal and various control signals to an electro-luminescence display device having a high resolution and a high pixel density, the defective bonding rate of the flexible film and the driver IC can be increased. Particularly, as the number of bonding pads increases and the defective bonding rate increases as the pad area decreases, the need for a test pad capable of inspecting bonding defects is recognized.

Specifically, the present disclosure recognizes that it is difficult to reduce the pad area in the process of manufacturing the driver IC film unit capable of supplying an image signal and various control signals to the electro-luminescence display device of high resolution and high pixel density. The pads of the driver IC film unit include a connection pad for bonding or attaching and a test pad for inspecting pass or fail of goods. Since each pad requires a wider width than a width of a signal wire, the area of the pads occupies a large portion of the area of the driver IC film unit. Particularly, in the case of a test pad, since it can be in contact with a test probe of the inspection equipment, more area is required than the connection pad.

Therefore, the present disclosure also recognizes the fact that more driver IC film units can be manufactured based on the same film area if the area of the test pads of the driver IC film unit can be reduced, and consequently, the manufacturing cost of the driver IC film unit can be reduced as a result.

Accordingly, an object of the present disclosure is to provide an electro-luminescence display device including a driver IC film unit capable of supplying image signals and various control signals to an electro-luminescence display device of high resolution and high pixel density while reducing manufacturing cost.

According to an aspect of the present disclosure, there is provided a driver IC film unit including a flexible film, a driver IC on a first surface of the flexible film and configured to receive an input signal and convert the input signal into an image signal for a display panel, at least first to third pad units, on the first surface of the flexible film, configured to electrically connect the driver IC and the flexible film, and at least first to third wire units, on the first surface of the flexible film, electrically connected to the at least first to third pad units, wherein at least one wire unit among the at least first to third wire units is configured to be extended to a second surface facing the first surface via a first via hole passing through the flexible film, and is configured to include a cut portion of wire corresponding to an edge of the flexible film.

The driver IC may be configured to output the image signal for the display panel through at least two pad units among the at least first to third pad units, and may be configured to receive the input signal through at least one pad unit among the at least first to third pad units, and at least one wire unit among the first to third wire units connected to each of the at least two pad units may be configured to include the first via hole and the cut portion of wire.

A wire unit extended to the second surface via the first via hole may be further extended to the first surface via a second via hole, and the at least one wire unit among the at least first to third wire units, may be only on the first surface, and may be disposed between the first via hole and the second via hole.

A wire unit extended through the first via hole and the second via hole may include the cut portion of wire that coincides with the edge of the flexible film.

The driver IC may be configured to include a switch configured to electrically switch the first pad unit and the second pad unit.

Each wire of the at least one wire unit of the first and second wire units may be divided into at least two branches, and one of the at least two branches may be extended up to the cut portion of wire.

According to another aspect of the present disclosure, there is provided an electro-luminescence display device including a display area including a plurality of pixels, a periphery area including a gate driver configured to drive the plurality of pixels, and a driver IC film unit configured to supply a signal applied to the plurality of pixels and the gate driver and disposed in the periphery area, wherein the driver IC film unit may include a flexible film, a driver IC on the flexible film, at least three pad units connecting to the driver IC and the flexible film, and at least three wire units extended from the at least three pad units, wherein at least one wire unit among the at least three wire units may include a cut portion of wire that matches with an edge of the flexible film, and wherein at least two pad units among the at least three pad units may be electrically connected to the periphery area.

The at least three pad units may be provided to both sides of the at least three wire units, respectively.

One side of the at least three pad units connected to the at least three wire units may be bonded to the driver IC, and another side of the at least one pad unit among the at least three pad units may have a larger pad size than another side of the other pad unit among the at least three pad units.

Another side of the at least one pad unit may be configured to have a multi-function.

The cut portion of wire may be formed by cutting the flexible film with a particular wire unit among the at least three wire units electrically connected to a test pad unit disposed outside the cut portion of wire.

The at least one wire unit among the at least three wire units may include a first metal layer disposed on the first surface of the flexible film and a second metal layer disposed on the second surface of the flexible film.

A first pad unit and a second pad unit among the at least three pad units, in contact with the driver IC, may be disposed adjacent to each other, and at least one wire unit, among a first wire unit connected to the first pad unit and a second wire unit connected to the second pad unit, may be divided into at least two branches.

According to the other aspect of the present disclosure, there is provided a driver IC film including a flexible film, a plurality of driver ICs on a first surface of the flexible film, a plurality of pad units, disposed on the first surface of the flexible film, corresponding to the plurality of driver ICs, respectively, and a plurality of wire units extended from the plurality of pad units, wherein at least one wire unit among the plurality of wire units may be extended to the second surface opposite to the first surface by a via hole passing through the flexible film, wherein the at least one wire unit extended by the via hole may be further extended over a reference cut line so as to be connected to a test pad unit disposed outside the reference cut line, and wherein the test pad unit may be disposed between the plurality of driver ICs.

At least one wire unit among the plurality of wire units may be divided into at least two branches for the test pad unit for testing line defect inspection.

The details of the embodiments are included in the detailed description and accompanying drawings.

According to the embodiments of the present disclosure, there is an advantage that the defective bonding of the driver IC can be inspected using the test pad unit.

Further, according to the embodiments of the present disclosure, there is an advantage that accuracy in checking the bonding failure of the driver IC can be improved without examining all the test pad units.

Further, according to the embodiments of the present disclosure, the test pad is configured to have a multi-function so that the manufacturing cost of the driver IC can be reduced and the production volume can be increased while checking the bonding failure of the driver IC.

It should be noted that the effects of the present disclosure are not limited to those described above and other effects of the present disclosure are included in the following descriptions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
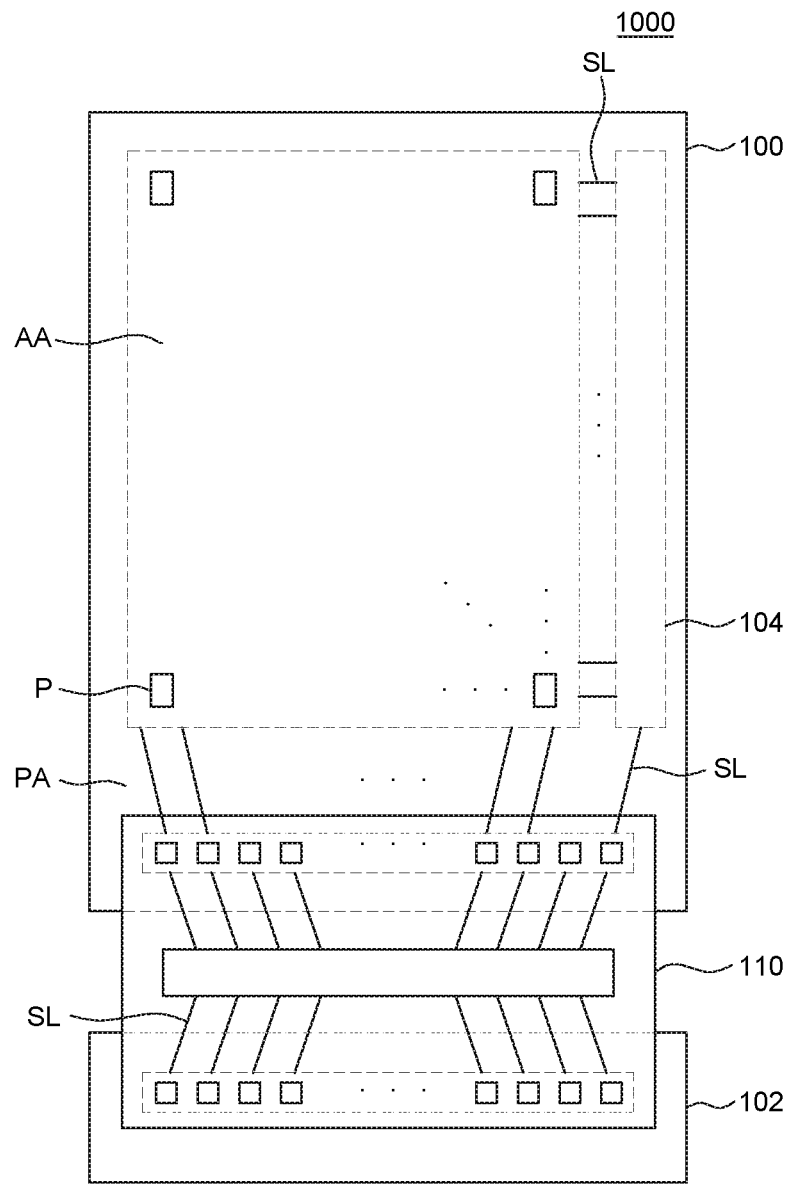
FIG. 1 is a conceptual diagram schematically illustrating an electro-luminescence display device according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two parts is described using the terms such as "on", "above", "below", and "next", one or more parts may be positioned between the two parts unless the terms are used with the term "immediately" or "directly".

It is to be understood that an element or layer is referred to as being "on" another element or layer, including either intervening layers or other elements directly on or in between.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

The sizes and thicknesses of the individual components shown in the drawings are shown merely for convenience of explanation and the present disclosure is not necessarily limited to the size and thickness of the components shown in the drawings.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

FIG. 1 is a conceptual diagram schematically illustrating an electro-luminescence display device according to an embodiment of the present disclosure.

An electro-luminescence display device 1000 according to an embodiment of the present disclosure may include a display panel 100 and a driver IC film unit 110 configured to supply a driving signal and an image signal to the display panel 100. The display panel 100 may be electrically connected to the system 102 by the driver IC film unit 110.

The system 102 may refer to a circuit unit for supplying an image to the electro-luminescence display device 1000. For example, the system 102 may be a processor of a smartphone, or a circuitry configured to generate a video signal, such as a graphics card of a computer. The system 102 may be embedded in the electro-luminescence display device 1000 or may be an external system.

A display panel 100 of an electro-luminescence display device 1000 according to an embodiment of the present disclosure may include a display area AA including a plurality of pixels P, and a peripheral area PA in which a plurality of signal wires SL configured to supply a video signal to the display area AA are disposed. The signal wire SL may refer to various kinds of conductive signal wire. It should be understood that the signal wire SL may be, for example, the gate wire and the data wire of the display panel 100, the signal lines of the driver IC film unit 110, and the signal wires of the system 102. The plurality of pixels P may be electrically connected to at least the gate wire and the data wire, and each pixel P is driven to display an image. The plurality of pixels P may include an electro-luminescence diode, a driving transistor, a switching transistor, and a capacitor. The switching transistor may apply a data voltage to the capacitor. The driving transistor may adjust the brightness of the pixel P by adjusting the amount of current supplied to the electro-luminescence diode in accordance with the voltage charged in the capacitor. The plurality of pixels P may be supplied with a high-potential voltage, a low-potential voltage, and a initialization voltage via a plurality of signal wires SL.

An initializing voltage may be supplied so that unnecessary light emission of the electro-luminescence diode is suppressed. The high potential voltage can be supplied to the driving transistor. The low potential voltage can be supplied to the cathode of the electro-luminescence diode.

A gate driver 104 may be disposed in the peripheral area PA and the gate driver 104 outputs a scan signal to switch the switching transistors of the plurality of pixels P. The gate driver 104 may include a plurality of shift registers. A signal for driving the gate driver 104 may be transmitted to the gate driver 104 through a plurality of signal wires SL.

Referring to FIG. 1, the driver IC film unit 110 may include a flexible film, a plurality of pad units formed on the flexible film, a driver IC disposed on the flexible film, and a plurality of signal lines SL connecting the driver IC and the plurality of pad units. A pad may be formed on one side of the driver IC film unit 110 and bonded or adhered to the display panel 100. Another pad may be formed on the other side of the driver IC film unit 110 and bonded or adhered to the system 102.

Figure 2:
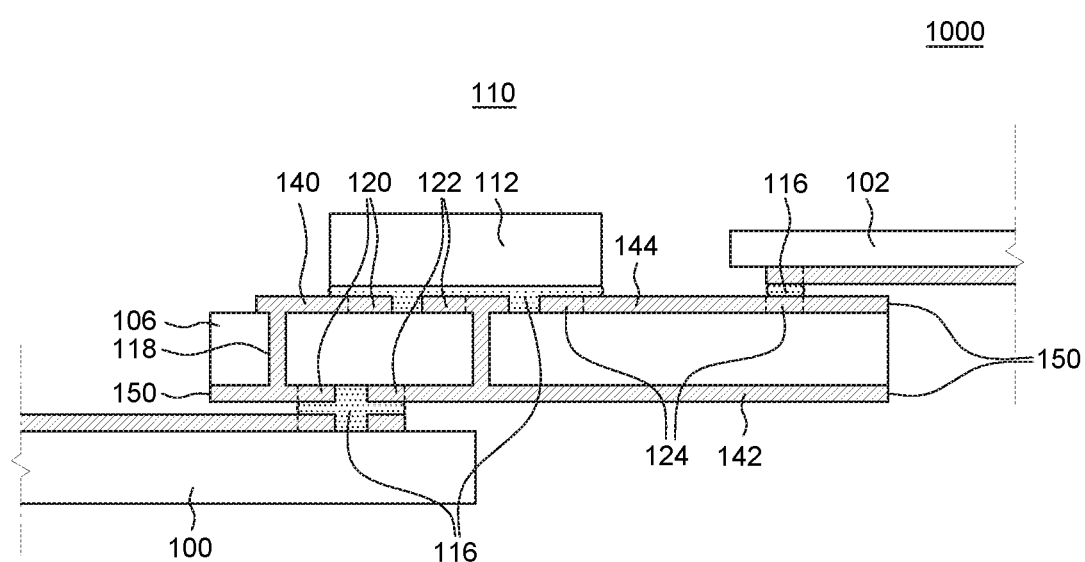
FIG. 2 is a cross-sectional view schematically illustrating a driver IC film unit of an electro-luminescence display device according to an embodiment of the present disclosure.
Figure 3:
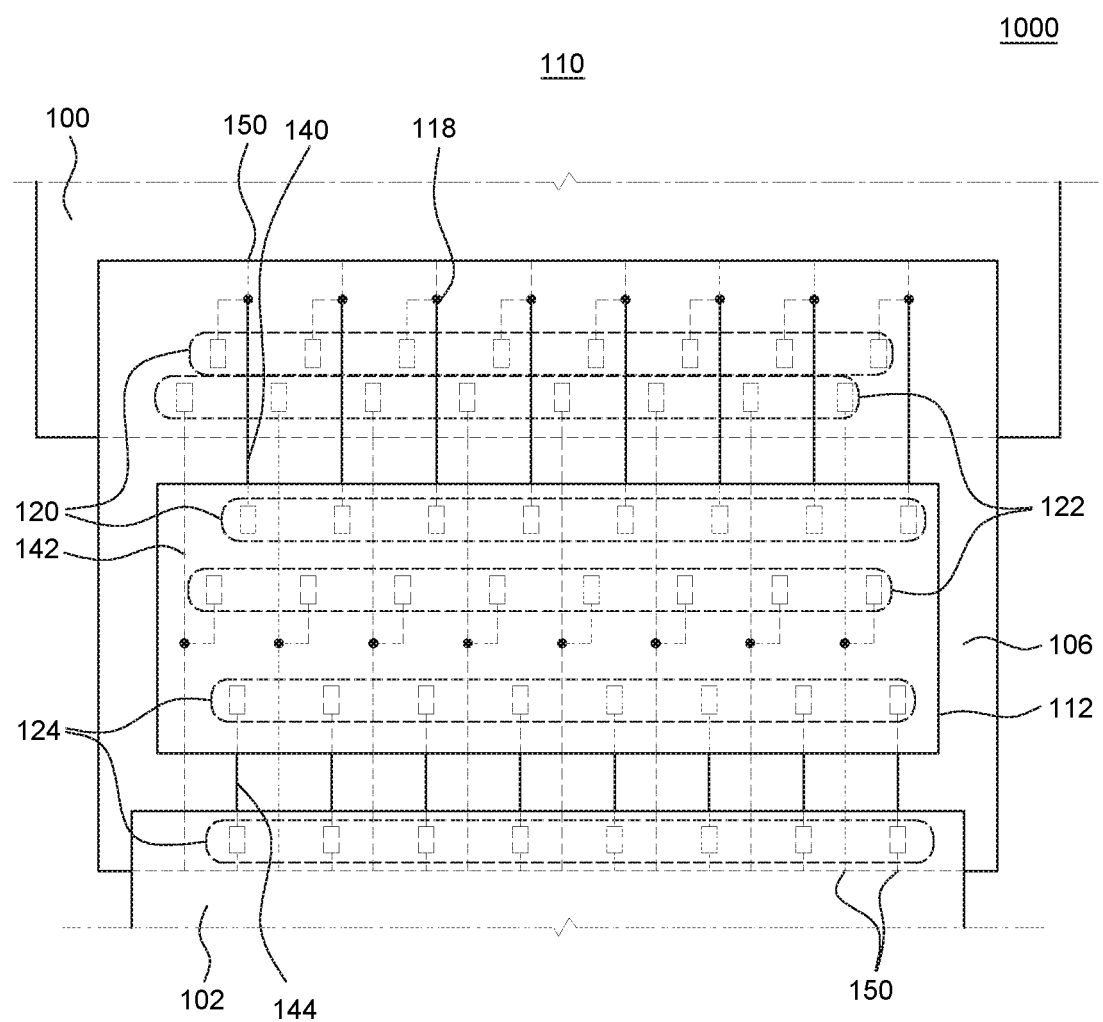
FIG. 3 is a plan view schematically illustrating a driver IC film unit of an electro-luminescence display device according to an embodiment of the present disclosure.
Figure 4:
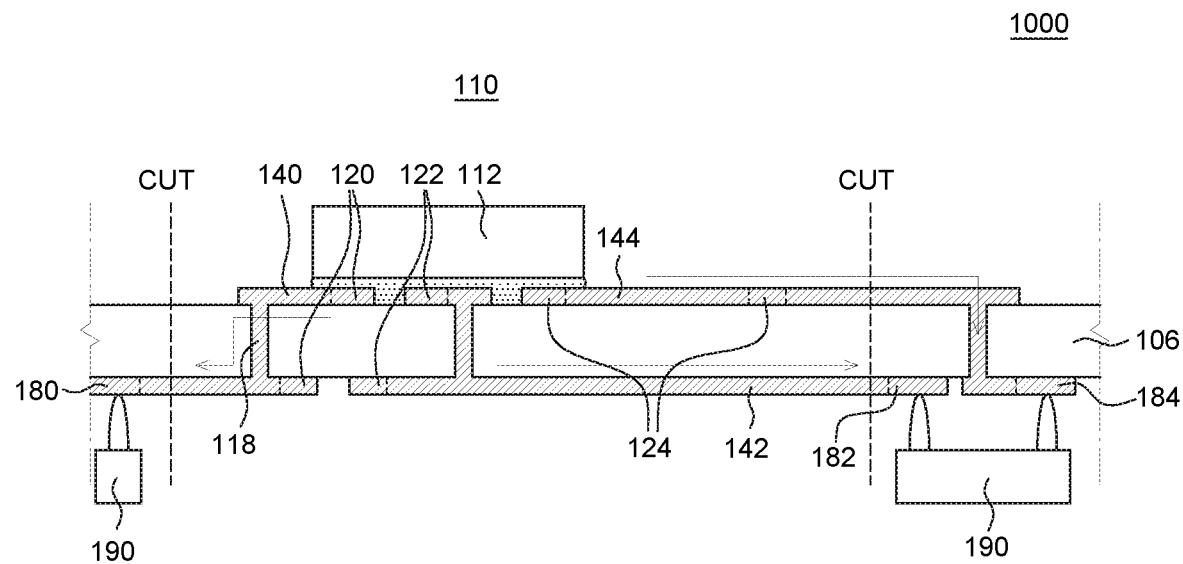
FIG. 4 is a cross-sectional view schematically illustrating a driver IC film unit and a test pad unit of an electro-luminescence display device according to an embodiment of the present disclosure.

FIG. 2 is a cross-sectional view schematically illustrating a driver IC film unit of an electro-luminescence display device according to an embodiment of the present disclosure. FIG. 3 is a plan view schematically illustrating a driver IC film unit of an electro-luminescence display device according to an embodiment of the present disclosure. FIG. 4 is a cross-sectional view schematically illustrating a driver IC film unit and a test pad unit of an electro-luminescence display device according to an embodiment of the present disclosure.

Referring to FIG. 2 to FIG. 4, a driver IC film unit 110 according to an embodiment of the present disclosure may include at least a flexible film 106, a driver IC 112 disposed on the flexible film 106, a plurality of pad units 120, 122 and 124 configured to electrically connect the driver IC 112 and the flexible film 106, a plurality of wire units 140, 142 and 144 electrically connected to the plurality of pad units 120, 122 and 124 of the flexible film 106, and a via hole 118.

It is to be understood that an embodiment of the present disclosure is merely for illustrative purpose. Thus, the present disclosure is not limited thereto, and may be selectively implemented in combination with other features of the embodiments of the present disclosure.

In addition, the electro-luminescence display device according to various embodiments of the present disclosure to be described below and the electro-luminescence display device 1000 according to an embodiment of the present disclosure may include substantially similar features.

The flexible film 106 of the driver IC film unit 110 may be configured to include a first surface and a second surface opposite to the first surface. As an example, a first metal layer may be formed on the first surface and a second metal layer may be formed on the second surface. The plurality of pad units 120, 122, 124 and the plurality of wire units 140, 142, 144 are configured to include at least one metal layer. The first metal layer and the second metal layer may be formed of the same material or different materials.

Each of the wire units 140, 142, 144 is configured to include a plurality of signal wires. The number of signal wires can be determined according to the pixel resolution of the display panel 100.

Each of the pad units 120, 122, 124 is configured to include a plurality of pads. Since the pad units are formed on both sides of the corresponding wire units, the number of pads can be substantially twice the number of signal wires. However, the present disclosure is not limited to the number of signal wires and the number of pads.

As an example, the first wire unit 140 may be configured to include both the first metal layer and the second metal layer, the second wire unit 142 may be configured to include both the first metal layer and the second metal layer, and the third wire unit 144 may be configured to include only the first metal layer. However, the present disclosure is not limited thereto, and each wire unit may be optionally configured to include more or less metal layers. Each metal layer may be a single layer, or may be composed of multiple layers.

The wire including a plurality of metal layers among the plurality of wire units 140, 142, and 144 is configured to pass through at least one via hole 118. The via hole 118 penetrates the flexible film 106, and electrically connects the first metal layer and the second metal layer. The wire in the via hole 118 is formed of the same material as the first metal layer and/or the second metal layer. However, the present disclosure is not limited thereto, and the wire in the via hole 118 may be formed of a conductive material different from the first metal layer or the second metal layer.

The pad units 120, 122, and 124 are electrically connected to the corresponding wire units 140, 142, and 144. For example, the first pad unit 120 is electrically connected to the first wire unit 140. The second pad unit 122 is electrically connected to the second wire unit 142. The third pad unit 124 is electrically connected to the third wire unit 144.

The third pad unit 124 among the plurality of pad units 120, 122, and 124 may be a pad unit configured to input a signal to the driver IC 112. However, the present disclosure is not limited thereto.

The first and second pad units 120 and 122 among the plurality of pad units 120, 122 and 124 may be a pad unit configured to supply a signal to the display panel 100. However, the present disclosure is not limited thereto.

The third wire unit 144 among the plurality of wire units 140, 142, and 144, may be a wire unit configured to input a signal to the driver IC 112. However, the present disclosure is not limited thereto.

The first and second wire units 140 and 142 among the plurality of wire units 140, 142 and 144 may be the wire units configured to supply a signal to the display panel 100.

However, the present disclosure is not limited thereto. For example, the first pad unit 120 is configured to include both the first metal layer and the second metal layer, the second pad unit 122 is configured to include both the first metal layer and the second metal layer, and the third pad unit 124 may be configured to include only the first metal layer. However, the present disclosure is not limited thereto, and each wire unit may be optionally configured to include more or less metal layers.

For example, the first pad unit 120 may be formed on both sides of the first wire unit 140. That is, one side of the first wire unit 140 is connected to the driver IC 112 by the first pad unit 120, and the other side of the first wire unit 140 is connected to the display panel 100 by the first pad unit 120.

For example, the second pad unit 122 may be formed on both sides of the second wire unit 142. That is, one side of the second wire unit 142 is connected to the driver IC 112 by the second pad unit 122, and the other side of the second wire unit 142 is connected to the display panel 100 by the second pad unit 122.

For example, the third pad unit 124 may be formed on both sides of the third wire unit 144. That is, one side of the third wire unit 144 is connected to the driver IC 112 by the third pad unit 124, and the other side of the third wire unit 144 is connected to system 102 by the third pad unit 124. The system 102 may be part of the electro-luminescence display device 1000, or it may be an external system.

The metal layer capable of forming the plurality of pad units 120, 122, and 124 and the plurality of wire units 140, 142, and 144 may be selected from metals having excellent conductivity. For example, it may be formed of a single layer or multiple layers made of copper (Cu), molybdenum (Mo), chromium (Cr), gold (Au), titanium (Ti), nickel (Ni), neodymium (Nd), or alloy thereof. However, the present disclosure is not limited thereto.

Different conductive adhesive members 116 may be used for the pads on one side and the other pads on the other side of each wire unit 140, 142, and 144. However, the present disclosure is not limited thereto, and it is possible to use the same conductive adhesion member 116.

For example, a pad of the first pad unit 120 in contact with the driver IC 112, that is, one side of the first pad unit 120 may be electrically connected to the driver IC 112 by tin (Sn) provided on the pad. A pad of the first pad unit 120 in contact with the display panel 100, that is, the other side of the first pad unit 120 may be electrically connected to the display panel 100 by an anisotropic conductive film (ACF), that is a conductive adhesive member 116 exemplarily provided on the pad.

For example, a pad of the second pad unit 122 in contact with the driver IC 112, that is, one side of the second pad unit 122 may be electrically connected to the driver IC 112 by tin (Sn) provided on the pad. A pad of the second pad unit 122 in contact with the display panel 100, that is, the other side of the second pad unit 122 may be electrically connected to the display panel 100 by an ACF, that is a conductive adhesive member 116 exemplarily provided on the pad.

For example, a pad of the third pad unit 124 in contact with the driver IC 112, that is, one side of the third pad unit 124 may be electrically connected to the driver IC 112 by tin (Sn) provided on the pad. A pad of the third pad unit 124 in contact with the system 102, that is, the other side of the third pad unit 124 may be electrically connected to the system 102 by an anisotropic conductive paste (ACP), that is a conductive adhesive member 116 exemplarily provided on the pad.

In addition, the same conductive adhesive member 116 may be used for all pad units in contact with the driver IC 112 among the plurality of pad units, but the present disclosure is not limited thereto.

In addition, the conductive material that electrically connects each of the pad units 120, 122 and 124 and the other components, for example, the display panel 100 and the system 102, can be selectively used according to the designed pad size, its application, manufacturing process conditions, and the like.

In addition, since one side and the other side of each of the pad units 120, 122 and 124 corresponding to the wire units 140, 142 and 144 connect components arranged on both sides. Thus, the shape and size of each of the pad units 120, 122, and 124 may be different depending on the characteristics of the elements. However, the present disclosure is not limited thereto, and it is possible that the pad units 120, 122, and 124 are formed to have the same shape and size.

At least one wire unit among the plurality of wire units 140, 142 and 144 of the electro-luminescence display device 1000 according to an exemplary embodiment of the present disclosure may be divided into at least two branches for the test pad unit required for defect inspection. For example, the first wire unit 140 may be divided into at least two branches on the second surface. The first branch of the first wire unit 140 extends to the first pad unit 120 and the second branch of the first wire unit 140 extends to the outer periphery of the flexible film 106.

The second branch of the first wire unit 140 is extended to one side of the flexible film 106 and is cut along with the flexible film 106. That is, the first wire unit 140 is configured to include the cut portion of wire 150 at the end of the flexible film 106.

In other words, the cut portion of wire 150 described in the exemplary embodiments of the present disclosure may be a portion where the plurality of wire units is cut.

The second wire unit 142 may be divided into at least two branches on the second surface. The first branch of the second wire unit 142 extends to the second pad unit 122 and the second branch of the second wire unit 142 extends to the outer periphery of the flexible film 106.

The second branch of the second wire unit 142 is extended to the other side of the flexible film 106 and is cut along with the flexible film 106. That is, the second wire unit 142 is configured to include the cut portion of wire 150.

The third wire unit 144 is extended to the other side of the flexible film 106 and is cut along with the flexible film 106. That is, the third wire unit 144 is configured to include the cut portion of wire 150.

Referring to FIG. 4, a state before the flexible film 106 of the electro-luminescence display 1000 according to an embodiment of the present disclosure is cut is shown. The plurality of wire units 140, 142, and 144 are formed to extend further than the cut portion of wire 150 before cut and electrically connected to the plurality of test pad units 180, 182, and 184.

The test pads 180, 182 and 184 may be disposed on the flexible film 106 before cutting. By each test pad, any defects of the driver IC film unit 110 can be inspected using a test probe 190. The pad area of the test pad units 180, 182, and 184 may be determined corresponding to the tip of the test probe 190. Further, there may be a problem of the size of the tip as the tip size is relatively large when inspecting the pads connected by the conductive adhesive member 116 due to the characteristics of the tip of the test probe 190. Accordingly, the areas of the test pads of the test pad units 180, 182 and 184 of the driver IC film unit 110 of the electro-luminescence display device 1000 according to the embodiment of the present disclosure are larger than the areas of the pads connected by the conductive adhesive member 116. Therefore, the test probe 190 can check the defect through the test pad units 180, 182, and 184.

After the inspection, the test pad units 180, 182, and 184 will be cut off, and the cut portion of wire 150 will be formed. Therefore, the defective bonding of the driver IC 112 can be inspected.

Techniques such as a laser, a cutting wheel, and the like can be used for cutting the flexible film 106 and the test pad units 180, 182 and 184. However, the present disclosure is not limited thereto, and various cutting tools and techniques capable of cutting the flexible film 106 and the plurality of wire units 140, 142, and 144 can be applied.

For example, the first test pad unit 180 may be disposed on the second surface of the flexible film 106, the second test pad unit 182 may be disposed on the second surface of the flexible film 106, and the third test pad unit 184 may be disposed on the second surface of the flexible film 106.

In addition, the third test pad unit 184 may be disposed on the second surface, and the third wire unit 144 is extended on the first surface over the area outside of the cut portion of wire 150 and is extended through the via hole disposed in the area outside of the cut portion of wire 150 to the third test pad unit 184. Therefore, even if, the third test pad unit 184 is disposed on the second surface, the cut portion of wire 150 with respect to the third test pad unit 184 may be formed on the first surface of the flexible film 106.

That is, the plurality of test pad units 180, 182, and 184 may be all disposed on the same surface.

In addition, the driver IC film unit 110 according to an embodiment of the present disclosure may include the flexible film 106, the driver IC 112, disposed on the first surface of the flexible film 106, configured to receive an input signal and convert the input signal into an image signal for a display panel 100, at least first to third pad units, 120, 122, and 124, on the first surface of the flexible film 106, configured to electrically connect the driver IC 112 and the flexible film 106, and at least first to third wire units 140, 142, and 144, on the first surface of the flexible film 106, electrically connected to the at least first to third pad units 120, 122, and 124.

In addition, at least one wire unit among the at least first to third wire units 140, 142, and 144 may be extended through a first via hole 118 passing through the flexible film 106 to a second surface facing the first surface, and may be configured to include a cut portion of wire 150 corresponding to an edge of the flexible film 106.

In the electro-luminescence display device 1000 according to an embodiment of the present disclosure, the plurality of pad units 120, 122, and 124 electrically connected to the driver IC 112 can be inspected by the test probe 190, since the plurality of test pad units 180, 182, and 184 can be removed after the inspection, the size of the driver IC film unit 110 can be reduced. Accordingly, the yield of the product can be improved by examining the defects of the driver IC 112. In addition, since the driver IC film unit 110 can be formed with a plurality of wires using a plurality of metal layers, it is possible to supply the video signal and various control signals to the electro-luminescence display device 1000 realized with high pixel resolution and high pixel density. In addition, since the test pad units 180, 182 and 184 can be formed on the same surface through the via hole 118, the positions of the test pad units 180, 182 and 184 can be formed on either the first surface or the second surface. Therefore, convenience for the operation of the test probe 190 can be provided.

If one of the plurality of test pad units 180, 182 and 184 is disposed on the opposite surface, the test probe 190 needs to contact both of the first and second surfaces of the flexible film 106. Due to the characteristics of the flexible film 106, it may be difficult to maintain the physical contact between the test probe 190 and the test pad, and the difficulty of manufacturing a test jig may be increased.

Such configuration in which a plurality of wires and a plurality of pads are formed at predetermined intervals and a plurality of driver ICs are mounted at predetermined intervals and the flexible film 106 is cut to a predetermined size may be referred to as a driver IC film unit. Such film in which a plurality of driver IC film units before being cut are arranged at predetermined intervals may be referred to as a driver IC film. The driver IC film may be in the form of a roll of film, or may be in the form of extending in one axis, but is not limited thereto.

Figure 5:
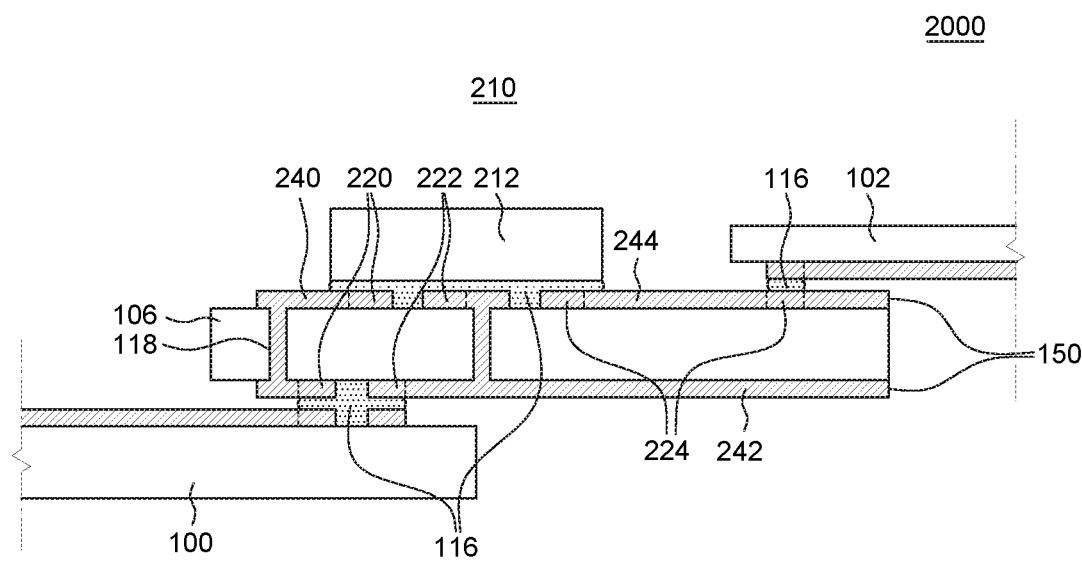
FIG. 5 is a cross-sectional view schematically illustrating a driver IC film unit of an electro-luminescence display device according to another embodiment of the present disclosure.
Figure 6:
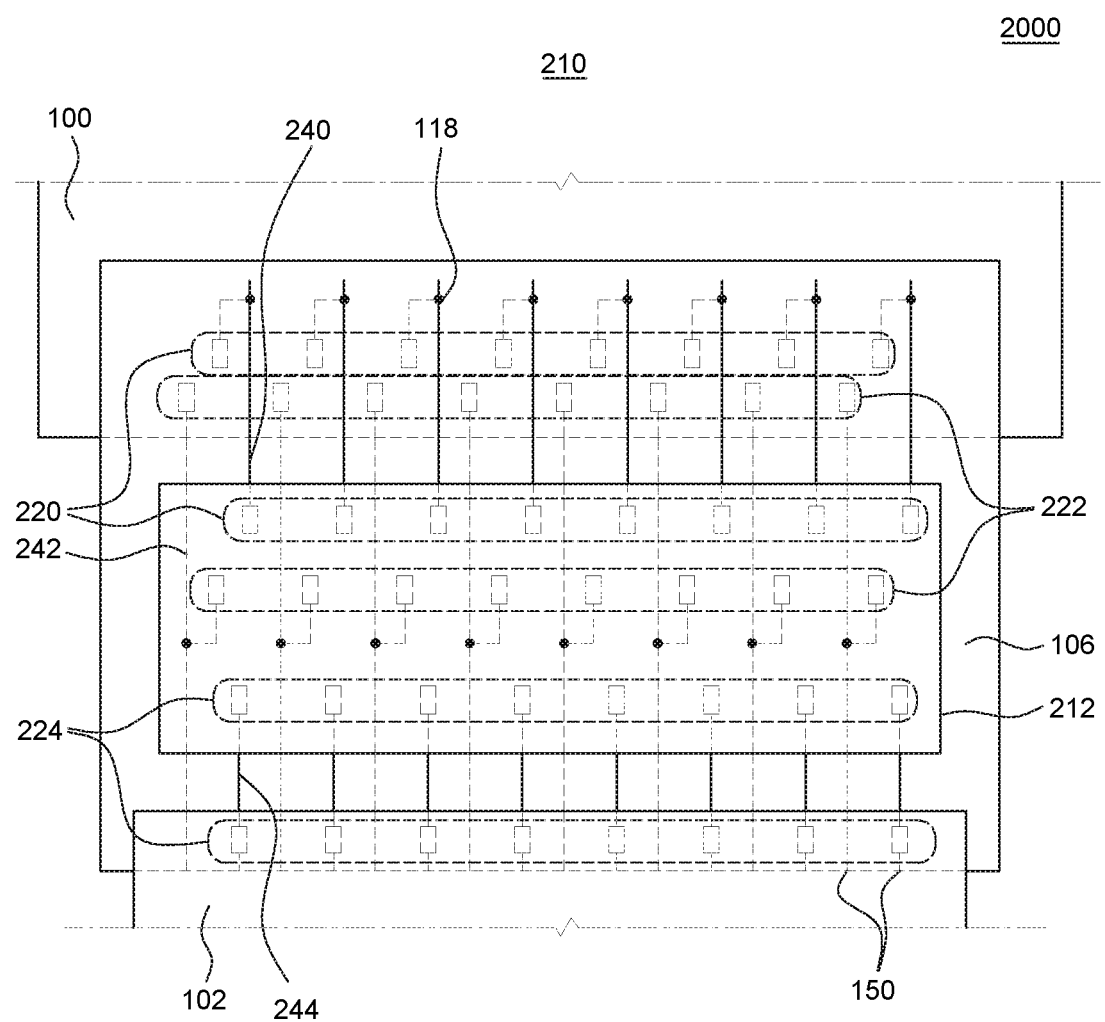
FIG. 6 is a plan view schematically illustrating a driver IC film unit of an electro-luminescence display device according to another embodiment of the present disclosure.
Figure 7:
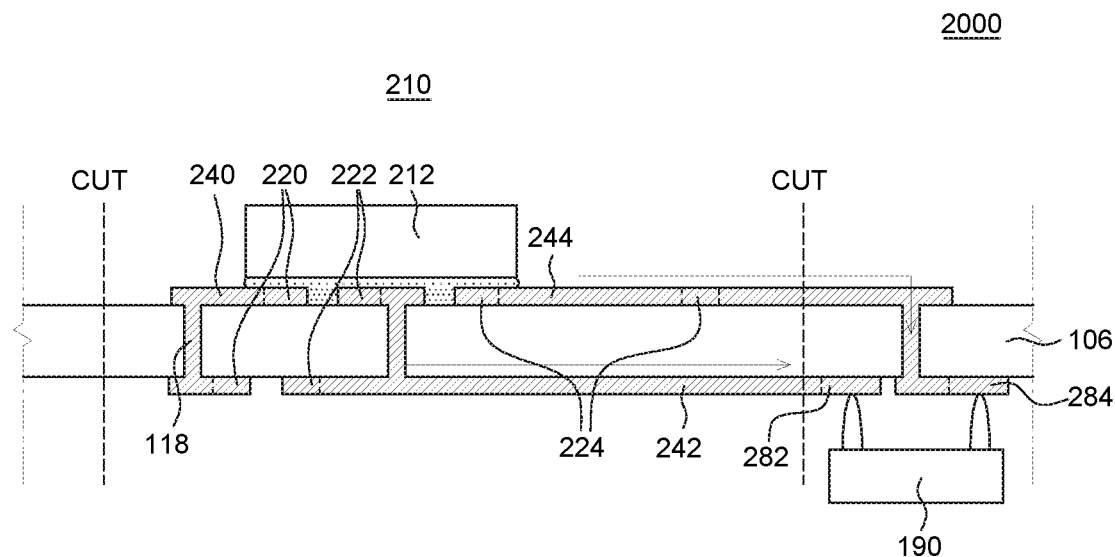
FIG. 7 is a cross-sectional view schematically illustrating a driver IC film unit and a test pad unit of an electro-luminescence display device according to another embodiment of the present disclosure.

FIG. 5 is a cross-sectional view schematically illustrating a driver IC film unit of an electro-luminescence display device according to another embodiment of the present disclosure. FIG. 6 is a plan view schematically illustrating a driver IC film unit of an electro-luminescence display device according to another embodiment of the present disclosure. FIG. 7 is a cross-sectional view schematically illustrating a driver IC film unit and a test pad unit of an electro-luminescence display device according to another embodiment of the present disclosure.

Referring to FIG. 5 to FIG. 7, a driver IC film unit 210 according to another embodiment of the present disclosure may include at least a flexible film 106, a driver IC 212 disposed on the flexible film 106, a plurality of pad units 220, 222, and 224 configured to electrically connect the driver IC 212 and the flexible film 106, a plurality of wire units 240, 242, and 244 electrically connected to each of the plurality of pad units 220, 222, and 224 of the flexible film 106, and a via hole 118.

It is to be understood that other embodiments of the present disclosure are merely illustrative and are not intended to be limiting the scope of the present disclosure, and may be implemented in combination with other features of embodiments of the present disclosure.

Further, an electro-luminescence display device according to various embodiments of the present disclosure and an electro-luminescence display device 2000 according to another embodiment of the present disclosure may include substantially similar configurations. Therefore, for the sake of convenience of description, redundant description may be omitted as necessary.

The plurality of pad units 220, 222, and 224 and the plurality of wire units 240, 242, and 244 are configured to include at least one metal layer.

The pad units 220, 222, and 224 are electrically connected to the corresponding wire units 240, 242, and 244.

However, the present disclosure is not limited thereto, and each wire unit may be optionally configured to include more metal layers.

A conductive adhesive member 116 may be used for the pad on one side and the pad on the other side of each wire unit 240, 242, and 244.

The first wire unit 240 may be divided into at least two branches on the second surface. However, the electro-luminescence display device 2000 according to another embodiment of the present disclosure is not limited thereto, and the first wire unit 240 may be configured to include only one branch.

The first wire unit 240 may be arranged inside the flexible film 106. That is, the first wire unit 240 may not be extended from the second surface to the outer edge of the flexible film 106.

The second wire unit 242 may include at least two branches on the second surface. The first branch of the second wire unit 242 extends to the second pad unit 222. The second branch of the second wire unit 242 extends to the outer periphery of the flexible film 106.

The second branch of the second wire unit 242 may be extended to the other side of the flexible film 106 and is cut along with the flexible film 106. That is, the second wire unit 242 may include the cut portion of wire 150.

The third wire unit 244 may be extended to the other side of the flexible film 106 and is cut along with the flexible film 106. That is, the third wire unit 244 may include the cut portion of wire 150.

Referring to FIG. 7, a state before the flexible film 106 of the electro-luminescence display 2000 according to another embodiment of the present disclosure is cut is shown. The plurality of wire units 242 and 244 are configured to be extended over the cut portion of wire 150 before cut and to be electrically connected to the plurality of test pad units 282 and 284.

Test pad units 282 and 284 may be disposed on the flexible film 106 before cutting and each test pad may be inspected using a test probe 190 so that the driver IC film unit 210 can be inspected. After the inspection, the test pad units 282 and 284 are cut off, and the cut portion of wire 150 is formed. Therefore, the bonding failure of the driver IC 212 can be inspected.

For example, the second test pad unit 282 is disposed on the second surface of the flexible film 106 and the third test pad unit 284 is disposed on the second surface of the flexible film 106.

In addition, third wire unit 244 is extended from the first surface to the outer region of the cut portion of wire 150 and is connected to the corresponding third test pad unit 284 disposed on the second surface via the via hole 118 disposed in the outer region of the cut portion of wire 150. Therefore, the cut portion of wire 150 of the third wire unit 244 is formed on the first surface of the flexible film 106.

That is, the plurality of test pad units 282 and 284 are all arranged on the same plane. Further, the plurality of test pads 282 and 284 are arranged only on the other side of the flexible film 106.

In addition, the driver IC film unit 210 according to another embodiment of the present disclosure may include a flexible film 106, a driver IC 212, disposed on the first surface of the flexible film 106, configured to convert a received input signal for the display panel 100, at least first to third pad units 220, 222, and 224, disposed on the first surface of the flexible film 106, configured to electrically connect the driver IC 212, and the flexible film 106, and at least first to third wire units 240, 242, and 244, disposed on the first surface of the flexible film 106, electrically connected to each of the at least first to third pad unit 220, 222, and 224.

Further, at least one wire unit of the at least first to third wire units 240, 242 and 244 is further extended to the second surface facing the first surface through the via hole 118 penetrating the flexible film 106, and a cut portion of wire 150 coinciding with an edge of the flexible film 106.

In the electro-luminescence display device 2000 according to another embodiment of the present disclosure, the plurality of pads 222 and 224 electrically connected to the driver IC 212 can be inspected by the test probe 190 and the plurality of test pad units 282 and 284 can be removed after the inspection. Accordingly, the size of the driver IC film unit 210 can be reduced and the yield of the product can be improved by examining the defects of the driver IC 212. In addition, since the driver IC film unit 210 can be formed with a plurality of wires using a plurality of metal layers, it is possible to supply the video signal and various control signals to the electro-luminescence display device 2000 realized with high pixel resolution and high pixel density. In addition, since the test pad units 282 and 284 can be formed on the same surface through the via hole 118, the positions of the test pad units 282, and 284 can be formed on either the first surface or the second surface. Therefore, convenience for the operation of the test probe 190 can be provided.

Further, in the electro-luminescence display device 2000 according to another embodiment of the present disclosure, the plurality of test pad units 282 and 284 are disposed only on the other side of the flexible film 106, the plurality of test pad units 282 and 284 on the other side of the flexible film 106 can be removed to reduce the area occupied by the plurality of test pad units 282 and 284 in the flexible film 106.

The first pad unit 220 and the second pad unit 222 that are in contact with the driver IC 212 of the electro-luminescence display 2000 according to another embodiment of the present disclosure are disposed adjacent to each other. Accordingly, even if only the second pad unit 222 is inspected by the second test pad unit 282, there is an advantage that the failure of the first pad unit 220 can be substantially inspected as well.

In addition, if the second test pad unit 282 is tested by the test probe 190 for inspecting the electrical connection between the second pad unit 222 and the driver IC 212 to confirm that the second pad unit 222 has no defects, then it can be predicted or assumed that there is substantially no defects with respect to the first pad unit 220. In order to predict the defect of the first pad unit 220 through the inspection of the second pad unit 222, the first pad unit 220 and the second pad unit 222 should be arranged adjacent to each other. In addition, the conductive adhesive member 116 applied to the first pad unit 220 and the second pad unit 222 should be the same material. In other words, the first pad unit 220 and the second pad unit 222 should be manufactured in the same process at the same time.

Thus, based on the flexible film 106 of the same area, a larger number of driver IC film units 210 can be produced than the driver IC film units 110 of the electro-luminescence display device 1000 according to an embodiment of the present disclosure. Thus, more products can be manufactured.

Figure 8:
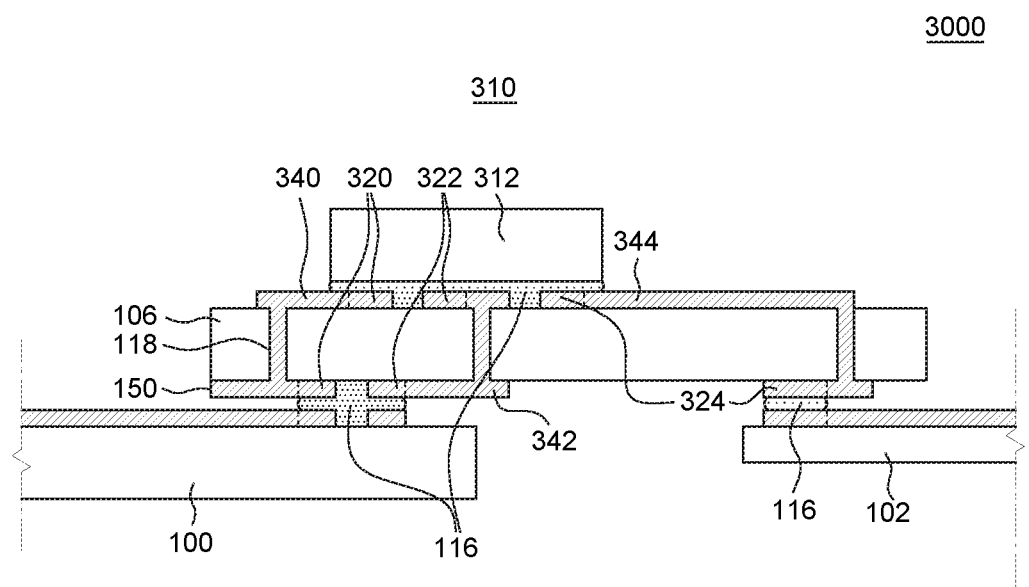
FIG. 8 is a cross-sectional view schematically illustrating a driver IC film unit of an electro-luminescence display device according to the other embodiment of the present disclosure.
Figure 9:
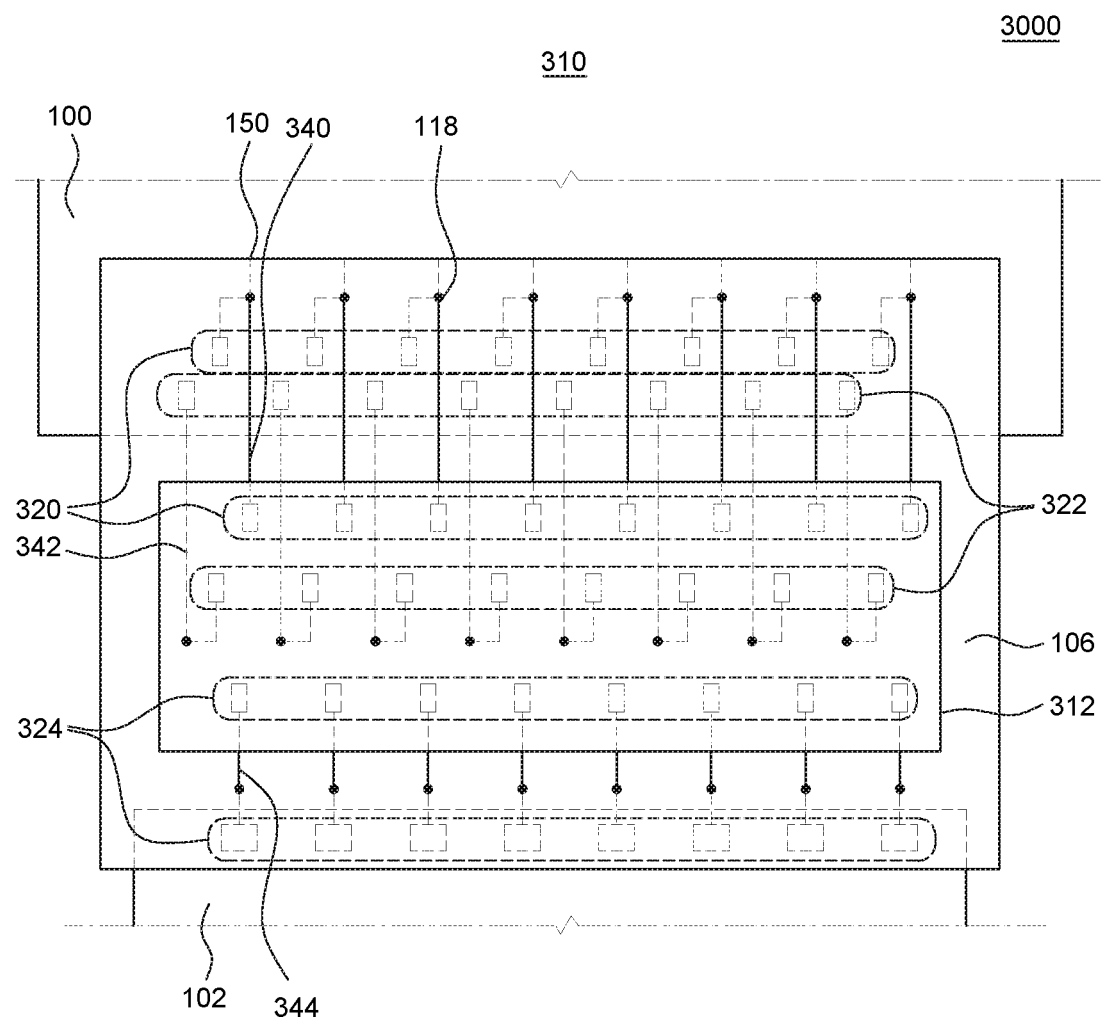
FIG. 9 is a plan view schematically illustrating a driver IC film unit of an electro-luminescence display device according to the other embodiment of the present disclosure.
Figure 10:
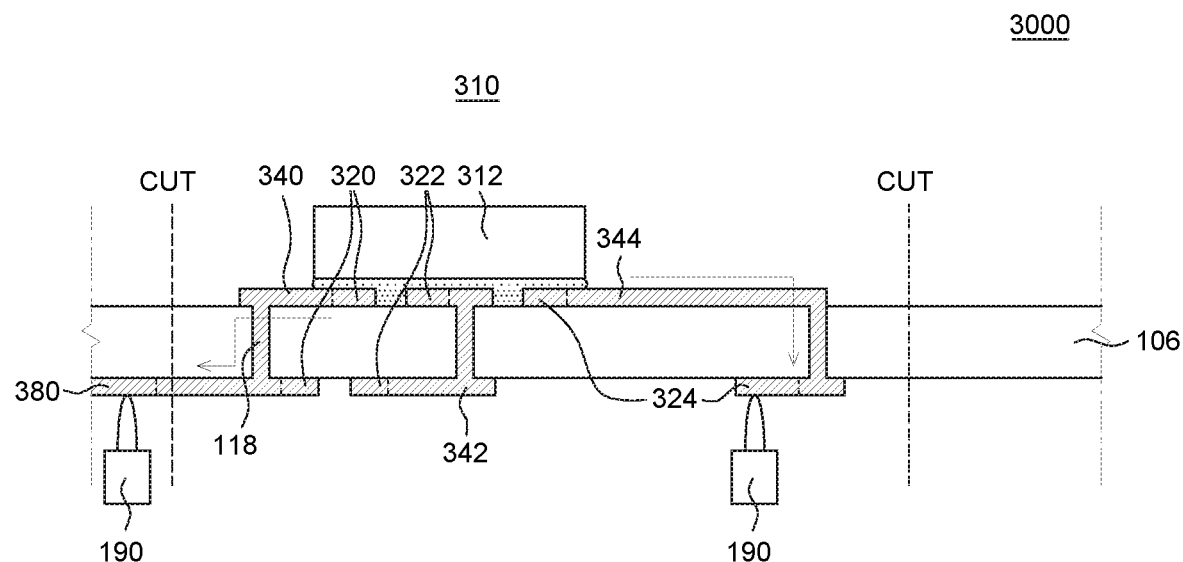
FIG. 10 is a cross-sectional view schematically illustrating a driver IC film unit and a test pad unit of an electro-luminescence display device according to the other embodiment of the present disclosure.

FIG. 8 is a cross-sectional view schematically illustrating a driver IC film unit of an electro-luminescence display device according to the other embodiment of the present disclosure. FIG. 9 is a plan view schematically illustrating a driver IC film unit of an electro-luminescence display device according to the other embodiment of the present disclosure. FIG. 10 is a cross-sectional view schematically illustrating a driver IC film unit and a test pad unit of an electro-luminescence display device according to the other embodiment of the present disclosure.

Referring to FIG. 8 to FIG. 10, the driver IC film unit 310 according to the other embodiment of the present disclosure may include a flexible film 106, a driver IC 312 disposed on the flexible film 106, a plurality of pad units 320, 322, and 324 configured to electrically connect the driver IC 312 and the flexible film 106, a plurality of wire units 340, 342, and 344 electrically connected to each of the plurality of pad units 320, 322, and 324 of the flexible film 106, and a via hole 118.

It is to be understood that the other embodiment of the present disclosure is merely illustrative and are not intended to limit the scope of the present disclosure, and may alternatively be implemented in combination with other features of the embodiments of the present disclosure.

In addition, since the electro-luminescence display device according to the various embodiments of the present disclosure and the electro-luminescence display device 3000 according to the other embodiment of the present disclosure include substantially similar configurations, for the sake of convenience of explanation only, redundant explanations may be omitted as necessary.

The plurality of pad units 320, 322, and 324 and the plurality of wire units 340, 342, and 344 are configured to include at least one metal layer.

For example, the first wire unit 340 is configured to include both the first metal layer and the second metal layer, the second wire unit 342 is configured to include both the first metal layer and the second metal layer, and the third wire unit 344 is configured to include both the first metal layer and the second metal layer.

For example, the first pad unit 320 is configured to include both the first metal layer and the second metal layer, the second pad unit 322 is configured to include both the first metal layer and the second metal layer, and the third pad unit 324 is configured to include both the first metal layer and the second metal layer.

However, the present disclosure is not limited thereto, and each wire unit may be optionally configured to include or exclude additional metal layers.

For example, the first pad unit 320 may be formed on both sides of the first wire unit 340 and the second pad unit 322 may be formed on both sides of the second wire unit 342, and the third pad unit 324 may be formed on both sides of the third wire unit 344.

A conductive adhesive member 116 may be used for the pad on one side and the other pad on the other side of each wire unit 340, 342, and 344.

The first wire unit 340 is configured to be divided into at least two branches on the second surface. The first branch of the first wire unit 340 extends to the first pad unit 320. The second branch of the first wire unit 340 extends to the outer periphery of the flexible film 106.

The second branch of the first wire unit 340 is extended to one side of the flexible film 106 and is cut along with the flexible film 106. That is, the first wire unit 340 is configured to include the cut portion of wire 150.

The second wire unit 342 is configured to be divided into at least two branches on the second surface. However, the electro-luminescence display device 3000 according to the other embodiment of the present disclosure is not limited thereto, and the second wire unit 342 may be configured to include only one branch.

The second wire unit 342 is arranged inside the flexible film 106. That is, the second wire unit 342 on the second surface is configured not to extend to the outer edge of the flexible film 106.

The third wire unit 344 is configured to be divided into at least two branches on the second surface. However, the electro-luminescence display device 3000 according to the other embodiment of the present disclosure is not limited thereto, and the third wire unit 344 may be configured to include only one branch.

The third wire unit 344 is arranged inside the flexible film 106. That is, the third wire unit 344 on the second surface is configured not to extend to the outer edge of the flexible film 106.

A pad disposed on the other side of the third wire unit 344 of the third pad unit 324 of the driver IC film unit 310 of the electro-luminescence display device 3000 according to the other embodiment of the present disclosure is configured to be connected to the system 102 and is configured to perform the function of the test pad unit at the same time.

In other words, since the second wire unit 342 does not extend to the outer edge of the flexible film 106 on the second surface, the area of the second wire unit 342 can be reduced. Accordingly, the third pad unit 324 may be disposed on the inner side of the flexible film 106 on the second side surface.

In other words, since the pads, disposed on the other side of the third wire unit 344 of the third pads 324, are configured to have a combined function, that is, a function for connecting the system 102 and the function for testing the pad. Accordingly, the pad area of each of the third pad units 324 is configured to have an area suitable for performing the function of the test pad.

In other words, each pad of the test pad unit according to embodiments of the present disclosure must correspond to the tip size of the test probe 190 because it is in contact with the test probe 190. Further, the pad area of a general test pad unit is configured to be wider than the pad area of the non-test pad unit, but is not limited thereto.

In other words, the areas of each of the pads of the first pad unit 320 and the second pad unit 322 of the electro-luminescence display device 3000 according to the other embodiment of the present disclosure are relatively smaller than the areas of each of the pads of the third pad unit 324, but it is not limited thereto.

In addition, when the pad area of each of the third pad units 324 is relatively larger, the manufacturing difficulty can be lowered, and the pad defects can be reduced.

In other words, since the third pad unit 324 bonded to the system 102 is disposed on the second surface, the position of the surface to which the driver IC film unit 310 is bonded can be changed. Accordingly, there is an advantage that the arrangement of the bonding pads can be easily modified as needed.

Referring to FIG. 10, a state before the flexible film 106 of the electro-luminescence display device 3000 according to other embodiment of the present disclosure is cut is shown. The first wire unit 340 may be extended over the cut portion of wire 150 when cut and may be electrically connected to the first test pad unit 380 before cut.

The first test pad unit 380 may be disposed on the flexible film 106 before cutting and the first test pad unit 380 may be inspected using the test probe 190 so that the driver IC film unit 310 can be inspected. After the inspection, the first test pad unit 380 is cut off, and the cut portion of wire 150 is formed. Therefore, the bonding failure of the driver IC 312 can be inspected.

In addition, the third pad unit 324, is formed so that the third wire unit 344 extends within the inner region of the flexible film 106 on the first surface, and is disposed on the second surface through the via hole 118 disposed in the inner region of the flexible film 106. In addition, the size of the pad of the third pad unit 324 is substantially equal to the pad size of the first test pad unit 380. Thus, the third pad unit 324 may be configured to concurrently perform the function of the connection with the system 102 and the test pad.

That is, the first test pad unit 380 and the third pad unit 324 are all disposed on the same surface.

In addition, a driver IC film unit 310 according to the other embodiment of the present disclosure may include a flexible film 106, a driver IC 312 disposed on a first surface of the flexible film 106, configured to convert a received input signal for a display panel 100, at least first to third pad units 320, 322, and 324, disposed on the first surface of the flexible film 106, configured to electrically connect the driver IC 312 and the flexible film 106, and at least first to third wire units 340, 342, and 344 electrically connected to each of the at least first to third pad units 320, 322, and 324.

At least one wire unit of the first to third wire units 340, 342 and 344 is further extended to the second surface facing the first surface through the via hole 118 passing through the flexible film 106, and a cut portion of wire 150 coinciding with a cut edge of the flexible film 106.

The electro-luminescence display device 3000 according to the other embodiment of the present disclosure can inspect the plurality of pads 320 and 324 electrically connected to the driver IC 312 with the test probe 190. Since the first test pad unit 380 can be removed after inspection, the size of the driver IC film unit 310 can be reduced, and the yield of the driver IC 312 can be improved by checking defects. Since the driver IC film unit 310 can form a plurality of wires using a plurality of metal layers, it is possible to supply the video signal and various control signals to the electro-luminescence display device 3000 realized with high resolution and high pixel density. The surfaces on which the first test pad unit 380 and the third pad unit 324 are formed can be the same due to the via hole 118. Accordingly, the positions of the first test pad unit 380 and the third pad unit 324 can be all disposed on the first surface or the second surface. Therefore, it is possible to provide convenience for the operation of the test probe 190.

In addition, according to the electro-luminescence display device 3000 according to the other embodiment of the present disclosure, the first test pad unit 380 is disposed only on one side of the flexible film 106. Therefore, the first test pad 380 on one side of the flexible film 106 can be removed, thereby reducing the area occupied by the first test pad unit 380 in the flexible film 106.

The first pad unit 320 and the second pad unit 322 which are in contact with the driver IC 312 of the electro-luminescence display 3000 according to the other embodiment of the present disclosure are disposed adjacent to each other. Therefore, even when only the first pad unit 320 is inspected by the first test pad unit 380, there is an advantage that the failure of the second pad unit 322 can be predicted as well. In addition, since the third pad unit 324 can simultaneously perform the function of the test pad unit, the third pad unit 324 may not require a separate test pad unit.

In addition, the first test pad unit 380 tests the electrical connection between the first pad unit 320 and the driver IC 312 with the test probe 190, so it can be checked that there is no defect in the first pad unit 320. In such case, there is an advantage that it can be predicted that there is substantially no defect of the second pad unit 322. In order to predict the failure of the second pad unit 322 through the inspection of the first pad unit 320, the first pad unit 320 and the second pad unit 322 should be disposed adjacent to each other. In addition, the conductive adhesive member 116 applied to the first pad unit 320 and the second pad unit 322 should be the same material. In other words, the first pad unit 320 and the second pad unit 322 should be manufactured in the same process at the same time.

Therefore, it is possible to produce a relatively larger number of driver IC film units 310 according to the other embodiment of the present disclosure than the driver IC film units 110 according to an embodiment of the present disclosure, assuming that the flexible film 106 having the same area. Therefore, the manufacturing cost can be reduced and the production volume can be increased.

Figure 11:
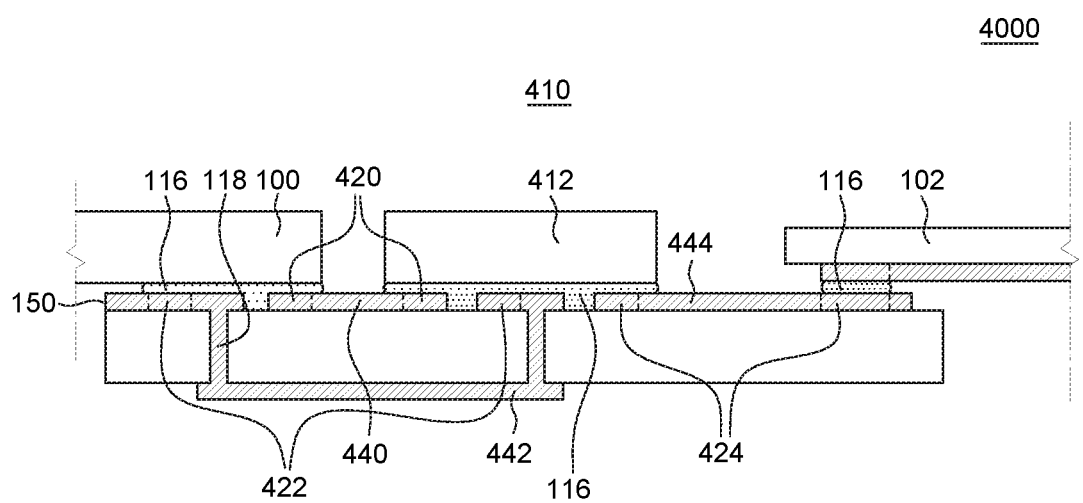
FIG. 11 is a cross-sectional view schematically illustrating a driver IC film unit of an electro-luminescence display device according to the other embodiment of the present disclosure.
Figure 12:
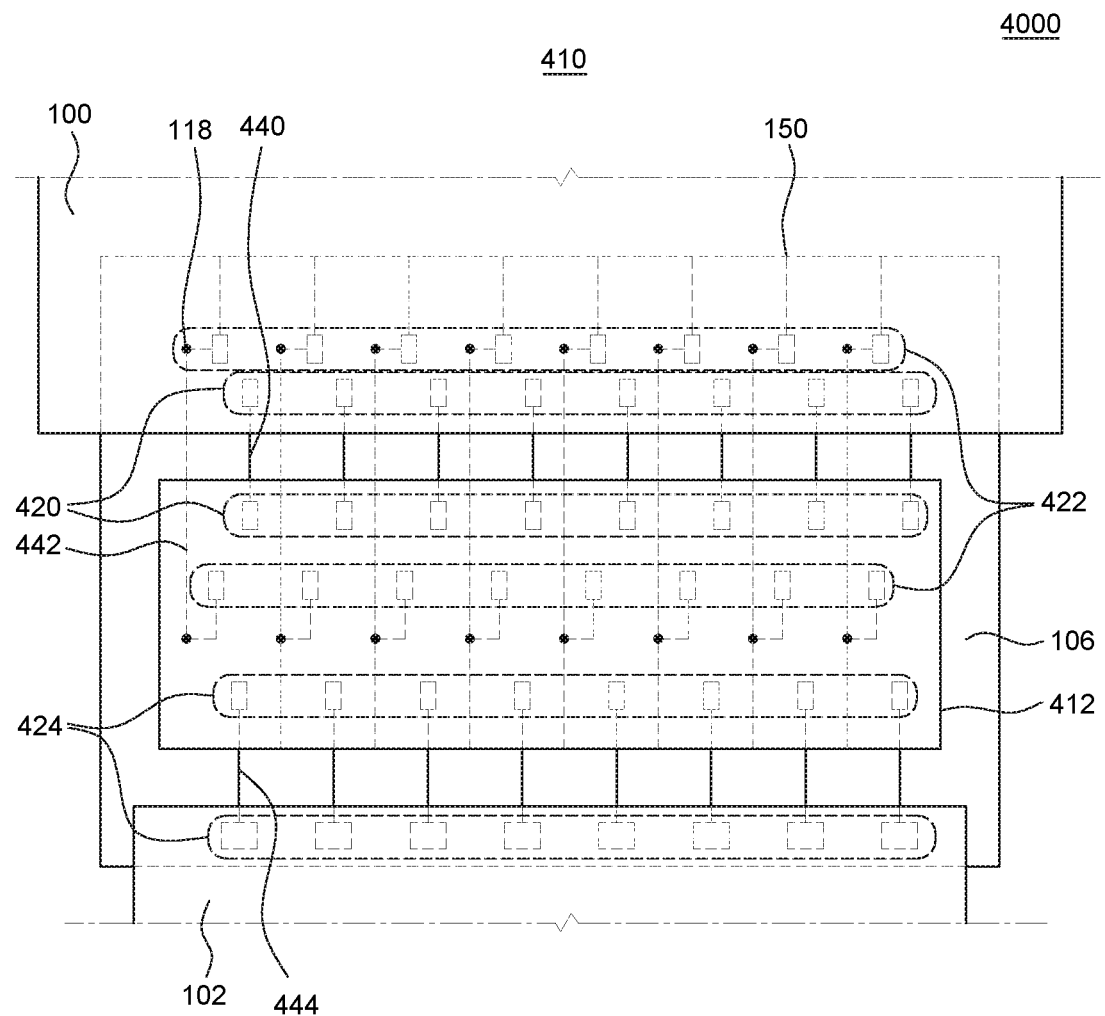
FIG. 12 is a plan view schematically illustrating a driver IC film unit of an electro-luminescence display device according to the other embodiment of the present disclosure.
Figure 13:
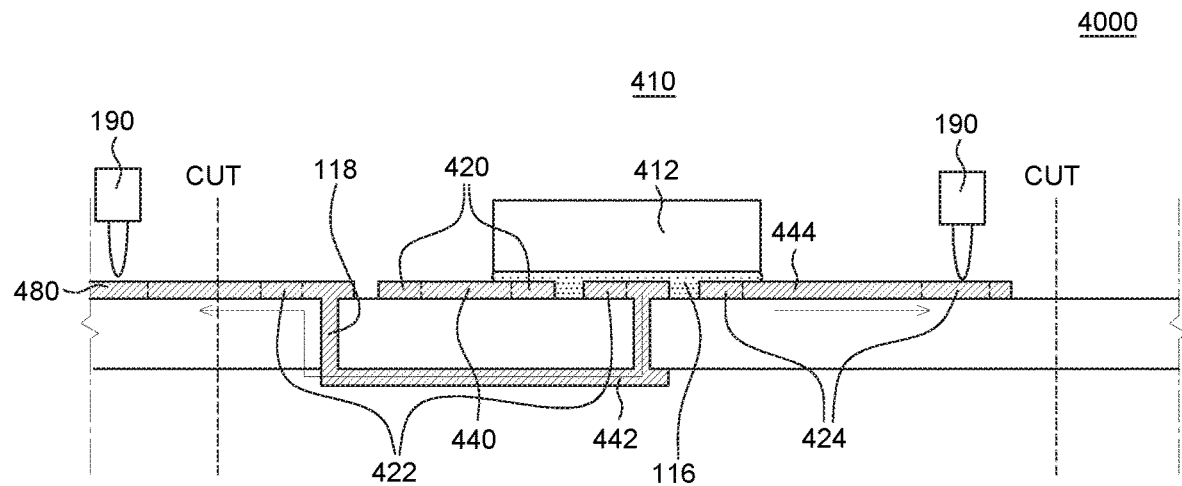
FIG. 13 is a cross-sectional view schematically illustrating a driver IC film unit and a test pad unit of an electro-luminescence display device according to another embodiment of the present disclosure.

FIG. 11 is a cross-sectional view schematically illustrating a driver IC film unit of an electro-luminescence display device according to the other embodiment of the present disclosure. FIG. 12 is a plan view schematically illustrating a driver IC film unit of an electro-luminescence display device according to the other embodiment of the present disclosure. FIG. 13 is a cross-sectional view schematically illustrating a driver IC film unit and a test pad unit of an electro-luminescence display device according to the other embodiment of the present disclosure.

Referring to FIG. 11 to FIG. 13, a driver IC film unit 410 according to the other embodiment of the present disclosure may include a flexible film 106, a driver IC 412 on the flexible film 106, a plurality of pad units 420, 422, and 424 configured to electrically connect the driver IC 412 and the flexible film 106, a plurality of wire units 440, 442, and 444 electrically connected each of the plurality of pad units 420, 422, and 424 of the flexible film 106, and a via hole 118.

It is to be understood that the other embodiment of the present disclosure are merely illustrative and are not intended to limit the scope of the present disclosure, and may be implemented in combination with other features of the embodiments of the present disclosure.

Further, an electro-luminescence display device according to various embodiments of the present disclosure and an electro-luminescence display device 4000 according to the other embodiment of the present disclosure may include substantially similar configurations. Therefore, for the sake of convenience of description, redundant description may be omitted as necessary.

The plurality of pad units 420, 422, and 424 and the plurality of wire units 440, 442, and 444 are configured to include at least one metal layer.

For example, the first wire unit 440 is configured to include only the first metal layer. The second wire unit 442 is configured to include both the first metal layer and the second metal layer. The third wire unit 444 is configured to include only the first metal layer.

For example, the first pad unit 420 is configured to include only the first metal layer. The second pad unit 422 is configured to include both the first metal layer and the second metal layer. The third pad unit 424 is configured to include only the first metal layer.

However, the present disclosure is not limited thereto, and each wire unit may be optionally configured to include particular metal layers.

For example, the first pad unit 420 may be formed on both sides of the first wire unit 440, the second pad unit 422 may be formed on both sides of the second wire unit 442, and the third pad unit 424 may be formed on both sides of the third wire unit 444.

A conductive adhesive member 116 may be used for the pads on one side and the other pads on the other side of each wire unit 440, 442, and 444.

The first wire unit 440 is configured to be divided into at least two branch on the first surface. However, the electro-luminescence display device 4000 according to the other embodiment of the present disclosure is not limited thereto, and it is also possible that the first wire unit 440 includes only one branch.

The first wire unit 440 is configured to be disposed inside the flexible film 106. That is, the first wire unit 440 is configured not to extend to the outer edge of the flexible film 106 on the first surface.

The second wire unit 442 is configured to be divided into at least two branch on the first surface. The first branch of the second wire unit 442 extends to the second pad unit 422 and the second branch of the second wire unit 442 extends to the outer periphery of the flexible film 106.

The second branch of the second wire unit 442 is extended to one side of the flexible film 106 and cut along with the flexible film 106. That is, the second wire unit 442 is configured to include the cut portion of wire 150.

Each wire of the second wire unit 442 extends to the second surface through the two via holes 118 penetrating the flexible film 106. Further, the second wire unit 442 is configured to surround the first wire unit 440 and the first pad unit 420.

The third wire unit 444 is configured to be divided into at least two branch on the first surface. However, the electro-luminescence display device 4000 according to the other embodiment of the present disclosure is not limited thereto, and the third wire unit 444 may be configured to include only one branch.

The third wire unit 444 is arranged inside the flexible film 106. That is, the third wire unit 444 is configured not to extend to the outer edge of the flexible film 106 on the second surface.

A pad disposed on the other side of the third wire unit 444 of the third pad unit 424 of the driver IC film unit 410 of the electro-luminescence display device 4000 according to the other embodiment of the present disclosure is connected to the system 102 and performs the function of the test pad unit at the same time.

In other words, since the third wire unit 444 is disposed only on the first surface of the flexible film 106, the area of the second wire unit 442 need not be considered. Thus, the third pad unit 424 can be disposed on the first surface inside the flexible film 106.

In other words, since the pads disposed on the other side of the third wire unit 444 of the third pad unit 424 are configured to have a combined function, that is, a function of the connection with the system 102 and the function of the test pad, the pad area of each of the third pad units 424 is configured to have an area suitable for performing the function of the test pad.

In addition, the areas of the pads of the first pad unit 420 and the second pad unit 422 of the electro-luminescence display device 4000 according to the other embodiment of the present disclosure are the same as those of the third pad units 424. However, the present disclosure is not limited to this.

Referring to FIG. 13, a state before the flexible film 106 of the electro-luminescence display device 4000 according to the other embodiment of the present disclosure is cut is shown. The second wire unit 442 may be longer than the cut portion of wire 150 when cut, and to be electrically connected to the test pad unit 480.

The test pad unit 480 may be disposed on the flexible film 106 before being cutting. The test probe 190 can be used to inspect the test pad unit 480 to inspect the driver IC film unit 410 for defects. After the inspection, the test pad unit 480 is cut off, and the cut portion of wire 150 is formed. Therefore, the bonding failure of the driver IC 412 can be inspected.

In other words, the third pad unit 424 is configured such that the third wire unit 444 extends from the first surface into the inner region of the flexible film 106 and is disposed on the first surface. The area of the pad of the third pad unit 424 is substantially equal to the pad area of the test pad unit 480. Thus, the third pad unit 424 may be configured to concurrently perform the function of the connection with the system 102 and the function of the test pad.

That is, the test pad unit 480 and the third pad unit 424 are all disposed on the same surface.

In addition, the driver IC film unit 410 according to the other embodiment of the present disclosure may include a flexible film 106, a driver IC 412 disposed on a first surface of the flexible film 106, configured to receive an input signal to convert into an image signal for a display panel 100, at least first to third pad units 420, 422, and 424 disposed on the first surface of the flexible film, configured to electrically connect the driver IC 412 and the flexible film 106, and at least first to third wire units 440, 442, and 444, disposed on the first surface of the flexible film 106, electrically connected to each of the at least first to third pad units 420, 422, and 424. At least one wire unit among the at least first to third wire units 440, 442, and 444 is further extended from the first surface to the second surface facing the first surface by a via hole 118 passing through the flexible film 106. A cut portion of wire 150 is formed at an edge of the flexible film 106.

According to the electro-luminescence display device 4000 according to the other embodiment of the present disclosure, the plurality of pad units 422 and 424 electrically connected to the driver IC 412 can be inspected by the test probe 190 and the test pad unit 480 can be removed after inspection. Further, the size of the driver IC 412 can be reduced and the yield of the driver IC 412 can be improved. Further, since the driver IC film unit 410 can form a plurality of wires using a plurality of metal layers, it is possible to supply the video signal and various control signals to the electro-luminescence display device 4000 realized with high resolution and high pixel density. In addition, since the test pad unit 480 and the third pad unit 424 can be formed on the same surface due to the via hole 118, the positions of the test pad unit 480 and the third pad unit 424 may be all disposed on the first surface or the second surface. Therefore, it is possible to provide convenience for the operation of the test probe 190.

Further, according to the electro-luminescence display device 4000 according to the other embodiment of the present disclosure, since the test pad unit 480 is disposed only on one side of the flexible film 106, the test pad 480 on one side of the flexible film 106 can be removed to reduce the area occupied by the test pad unit 480 in the flexible film 106.

The first pad unit 420 and the second pad unit 422 which are in contact with the driver IC 412 of the electro-luminescence display device 4000 according to the other embodiment of the present disclosure are disposed adjacent to each other. Therefore, even if only the second pad unit 422 is inspected by the test pad unit 480, there is an advantage that the failure of the first pad unit 420 can be predicted as well. Also, since the third pad unit 424 can simultaneously perform the function of the test pad unit, the third pad unit 424 does not require a separate test pad unit.

The test pad unit 480 tests the electrical connection between the second pad unit 422 and the driver IC 412 with the test probe 190. When it is confirmed that there is no defect in the second pad unit 422, there is an advantage that it can be predicted that there is no defect in the first pad unit 420 substantially. In order to predict the failure of the first pad unit 420 through the inspection of the second pad unit 422, the first pad unit 420 and the second pad unit 422 should be arranged adjacent to each other. Further, the conductive adhesive member 116 applied to the first pad unit 420 and the second pad unit 422 should be the same material. In other words, the first pad unit 420 and the second pad unit 422 must be simultaneously manufactured by the same process.

Therefore, it is possible to produce a relatively larger number of driver IC film units 410 according to the other embodiment of the present disclosure than the driver IC film units 110 according to an embodiment of the present disclosure, assuming that the flexible film 106 having the same area. Therefore, the manufacturing cost can be reduced and the production volume can be increased.

Figure 14:
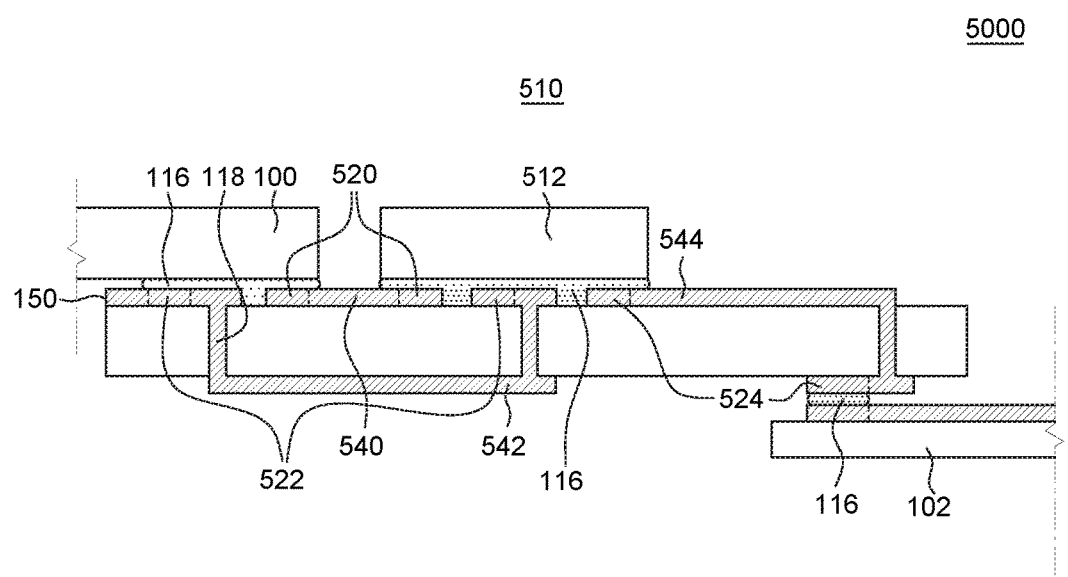
FIG. 14 is a cross-sectional view schematically illustrating a driver IC film unit of an electro-luminescence display device according to the other embodiment of the present disclosure.
Figure 15:
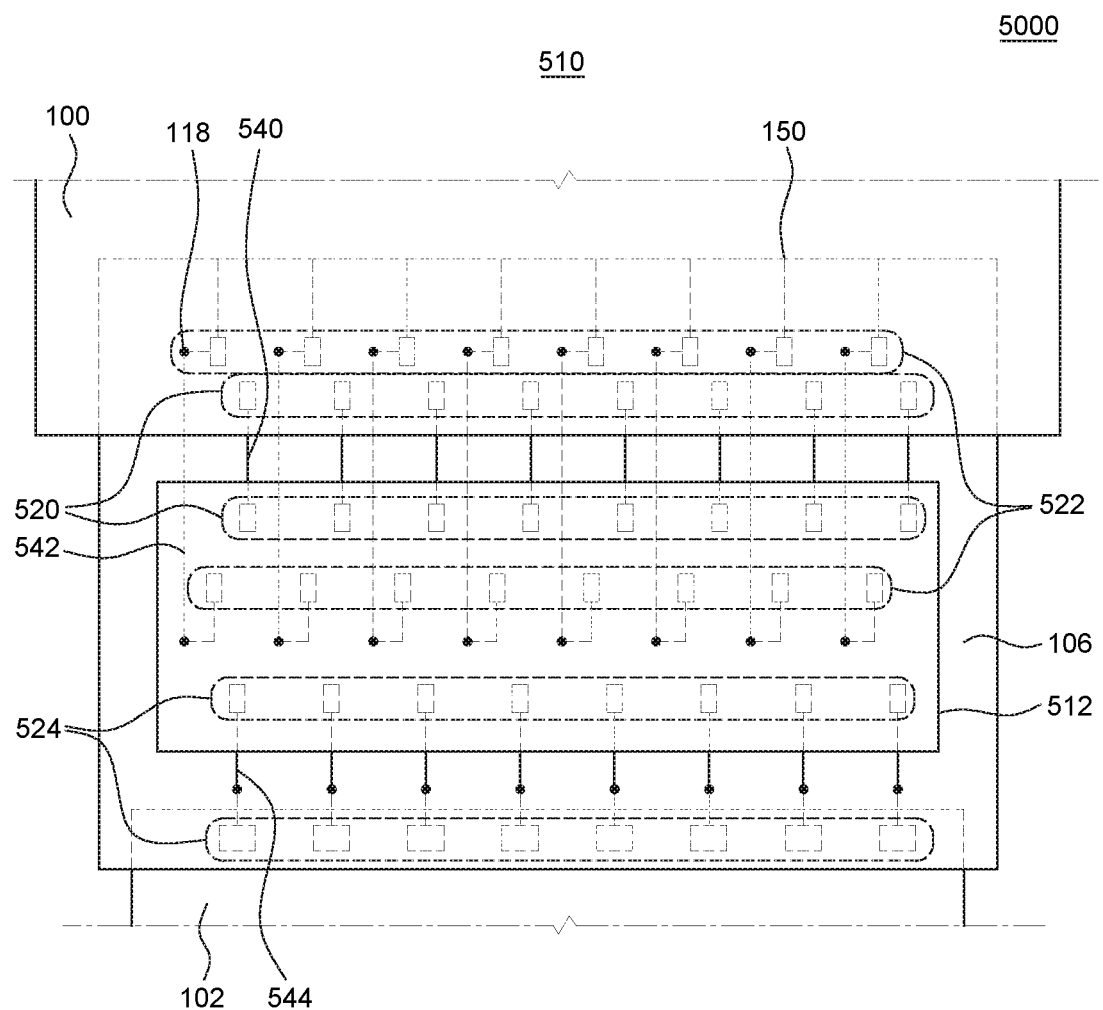
FIG. 15 is a plan view schematically illustrating a driver IC film unit of an electro-luminescence display device according to the other embodiment of the present disclosure.
Figure 16:
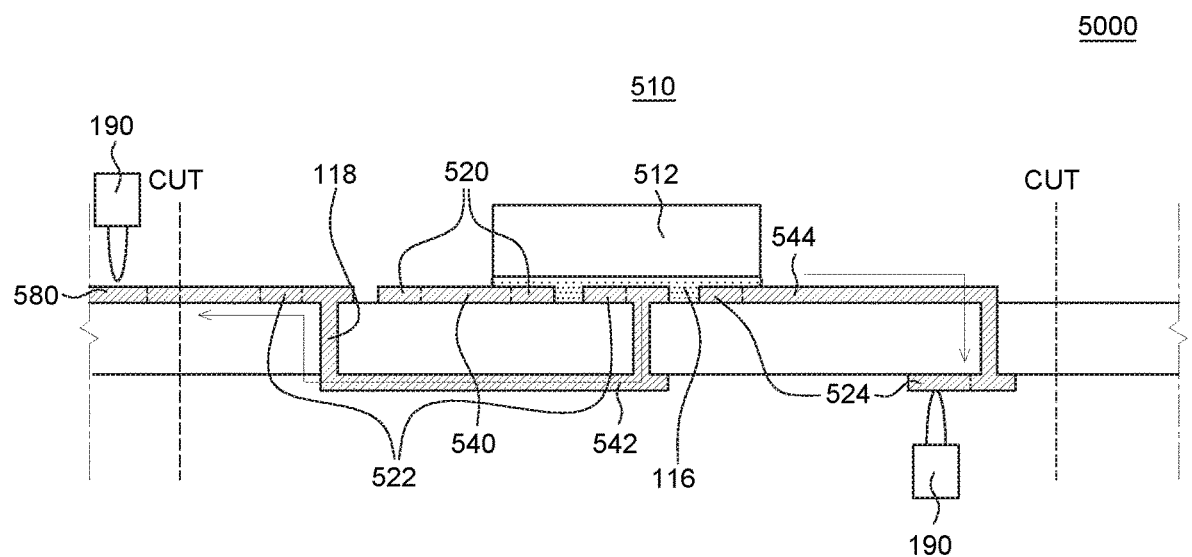
FIG. 16 is a cross-sectional view schematically illustrating a driver IC film unit and a test pad unit of an electro-luminescence display device according to the other embodiment of the present disclosure.

FIG. 14 is a cross-sectional view schematically illustrating a driver IC film unit of an electro-luminescence display device according to the other embodiment of the present disclosure. FIG. 15 is a plan view schematically illustrating a driver IC film unit of an electro-luminescence display device according to the other embodiment of the present disclosure. FIG. 16 is a cross-sectional view schematically illustrating a driver IC film unit and a test pad unit of an electro-luminescence display device according to the other embodiment of the present disclosure.

It is to be understood that the other embodiment of the present disclosure are merely illustrative and are not intended to limit the scope of the present disclosure, and may be implemented in combination with other features of the embodiments of the present disclosure.

Further, an electro-luminescence display device according to various embodiments of the present disclosure and an electro-luminescence display device 5000 according to the other embodiment of the present disclosure may include substantially similar configurations. Therefore, for the sake of convenience of description, redundant description may be omitted as necessary.

The first pad unit 520, the first wire unit 540, the second pad unit 522, the second wire unit 524, and the test pad unit 580 of the electro-luminescence display device 5000 according to other embodiment of the present disclosure are substantially the same as the first pad unit 420, the first wire unit 440, the second pad unit 422, the second wire unit 424, and the test pad unit 480 of the electro-luminescence display device 4000 according to other embodiment of the present disclosure, thus redundant explanation may be omitted.

The third pad unit 524 and the third wire unit 544 of the electro-luminescence display device 5000 according to other embodiment of the present disclosure are substantially the same as the third pad unit 324 and the third wire unit 344 of the electro-luminescence display device 3000 according to other embodiment of the present disclosure, thus redundant explanation may be omitted.

The electro-luminescence display 5000 according to the other embodiment of the present disclosure has an advantage that the features of the electro-luminescence displays 3000 and 4000 according to the other embodiments of the present disclosure can be selected and configured. Therefore, it is easy to modify the design, and it is easy to satisfy various design requirements based on the disclosed features of the present disclosure.

In some embodiments, the driver IC may further include a switch configured to electrically switch the first pad unit and the second pad unit provided in the driver IC. According to the above-described configuration, the test probe can sequentially switch and examine the first pad unit and the second pad unit through the test pad unit, but the present disclosure is not limited thereto.

In some embodiments, the plurality of wire units may be covered with an insulating layer. According to the above-described configuration, it is possible to reduce corroding of the plurality of wire units caused by exposed portion of the insulating layer and electrically short-circuited problem regarding the adjacent signal wires. However, the present disclosure is not limited thereto.

The driver IC film, the driver IC film unit, and the electro-luminescence display device according to the embodiments of the present disclosure can also be described as follows:

A driver IC film unit according to the embodiments of the present disclosure may include a flexible film, a driver IC on a first surface of the flexible film and configured to receive an input signal and convert the input signal into an image signal for a display panel, at least first to third pad units, on the first surface of the flexible film, configured to electrically connect the driver IC and the flexible film, and at least first to third wire units, on the first surface of the flexible film, electrically connected to the at least first to third pad units, at least one wire unit among the at least first to third wire units is configured to be extended to a second surface facing the first surface via a first via hole passing through the flexible film, and is configured to include a cut portion of wire corresponding to an edge of the flexible film.

The driver IC may be configured to output the image signal for the display panel through at least two pad units among the at least first to third pad units, and may be configured to receive the input signal through at least one pad unit among the at least first to third pad units, and at least one wire unit among the first to third wire units connected to each of the at least two pad units may be configured to include the first via hole and the cut portion of wire.

A wire unit extended to the second surface via the first via hole may be further extended to the first surface via a second via hole, and the at least one wire unit among the at least first to third wire units, may be only on the first surface, and may be disposed between the first via hole and the second via hole.

A wire unit extended through the first via hole and the second via hole may include the cut portion of wire that coincides with the edge of the flexible film.

The driver IC may be configured to include a switch configured to electrically switch the first pad unit and the second pad unit.

Each wire of the at least one wire unit of the first and second wire units may be divided into at least two branches, and one of the at least two branches may be extended up to the cut portion of wire.

An electro-luminescence display device according to the embodiments of the present disclosure may include a display area including a plurality of pixels, a periphery area including a gate driver configured to drive the plurality of pixels, and a driver IC film unit configured to supply a signal applied to the plurality of pixels and the gate driver and disposed in the periphery area, wherein the driver IC film unit includes a flexible film, a driver IC on the flexible film, at least three pad units connecting to the driver IC and the flexible film, and at least three wire units extended from the at least three pad units, wherein at least one wire unit among the at least three wire units may include a cut portion of wire that matches with an edge of the flexible film, and wherein at least two pad units among the at least three pad units may be electrically connected to the periphery area.

The at least three pad units may be provided to both sides of the at least three wire units, respectively.

One side of the at least three pad units connected to the at least three wire units may be bonded to the driver IC, and another side of the at least one pad unit among the at least three pad units may have a larger pad size than another side of the other pad unit among the at least three pad units.

Another side of the at least one pad unit may be configured to have a multi-function.

The cut portion of wire may be formed by cutting the flexible film with a particular wire unit among the at least three wire units electrically connected to a test pad unit disposed outside the cut portion of wire.

The at least one wire unit among the at least three wire units may include a first metal layer disposed on the first surface of the flexible film and a second metal layer disposed on the second surface of the flexible film.

A first pad unit and a second pad unit among the at least three pad units, in contact with the driver IC, may be disposed adjacent to each other, and at least one wire unit, among a first wire unit connected to the first pad unit and a second wire unit connected to the second pad unit, may be divided into at least two branches.

A driver IC film according to the embodiments of the present disclosure may include a flexible film, a plurality of driver ICs on a first surface of the flexible film, a plurality of pad units, disposed on the first surface of the flexible film, corresponding to the plurality of driver ICs, respectively, and a plurality of wire units extended from the plurality of pad units, wherein at least one wire unit among the plurality of wire units may be extended to the second surface opposite to the first surface by a via hole passing through the flexible film, wherein the at least one wire unit extended by the via hole may be further extended over a reference cut line so as to be connected to a test pad unit disposed outside the reference cut line, and wherein the test pad unit may be disposed between the plurality of driver ICs.

At least one wire unit among the plurality of wire units may be divided into at least two branches for the test pad unit for testing line defect inspection.

It will be apparent to those skilled in the art that various modifications and variations can be made in the present disclosure without departing from the technical scope of the present disclosure. Therefore, the technical scope of the present disclosure should not be limited to the contents described in the detailed description of the specification, but should be defined by the appended claims.

What is claimed is:

1. A driver IC film unit including:
   a flexible film;
   a driver IC on a first surface of the flexible film and configured to receive an input signal and convert the input signal into an image signal for a display panel;
   at least first to third pad units, on the first surface of the flexible film, configured to electrically connect the driver IC and the flexible film; and
   at least first to third wire units, on the first surface of the flexible film, electrically connected to the at least first to third pad units,
   wherein at least one wire unit among the at least first to third wire units is configured to be extended to a second surface facing the first surface via a first via hole passing through the flexible film, and is configured to include a cut portion of wire corresponding to an edge of the flexible film.

2. The driver IC film unit of claim 1,
   wherein the driver IC is configured to output the image signal for the display panel through at least two pad units among the at least first to third pad units, and is configured to receive the input signal through at least one pad unit among the at least first to third pad units, and
   wherein at least one wire unit among the first to third wire units connected to each of the at least two pad units is configured to include the first via hole and the cut portion of wire.

3. The driver IC film unit of claim 2,
   wherein a wire unit extended to the second surface via the first via hole is further extended to the first surface via a second via hole, and
   wherein the at least one wire unit among the at least first to third wire units, is only on the first surface, and is disposed between the first via hole and the second via hole.

4. The driver IC film unit of claim 2,
   wherein a wire unit extended through the first via hole and the second via hole includes the cut portion of wire that coincides with the edge of the flexible film.

5. The driver IC film unit of claim 1,
   wherein the driver IC is configured to include a switch configured to electrically switch the first pad unit and the second pad unit.

6. The driver IC film unit of claim 1,
   wherein each wire of the at least one wire unit of the first and second wire units is divided into at least two branches, and
   wherein one of the at least two branches is extended up to the cut portion of wire.

7. An electro-luminescence display device comprising:
   a display area including a plurality of pixels;
   a periphery area including a gate driver configured to drive the plurality of pixels; and
   a driver IC film unit configured to supply a signal applied to the plurality of pixels and the gate driver and disposed in the periphery area,
   wherein the driver IC film unit includes a flexible film, a driver IC on the flexible film, at least three pad units connecting to the driver IC and the flexible film, and at least three wire units extended from the at least three pad units,
   wherein at least one wire unit among the at least three wire units includes a cut portion of wire that matches with an edge of the flexible film, and
   wherein at least two pad units among the at least three pad units are electrically connected to the periphery area.

8. The electro-luminescence display device of claim 7,
   wherein the at least three pad units are provided to both sides of the at least three wire units, respectively.

9. The electro-luminescence display device of claim 8,
   wherein one side of the at least three pad units connected to the at least three wire units are bonded to the driver IC, and
   wherein another side of the at least one pad unit among the at least three pad units has a larger pad size than another side of the other pad unit among the at least three pad units.

10. The electro-luminescence display device of claim 9,
    wherein the another side of the at least one pad unit is configured to have a multi-function.

11. The electro-luminescence display device of claim 7,
    wherein the cut portion of wire is formed by cutting the flexible film with a particular wire unit among the at least three wire units electrically connected to a test pad unit disposed outside the cut portion of wire.

12. The electro-luminescence display device of claim 7, wherein the at least one wire unit among the at least three wire units includes a first metal layer disposed on the first surface of the flexible film and a second metal layer disposed on the second surface of the flexible film.

13. The electro-luminescence display device of claim 7, wherein a first pad unit and a second pad unit among the at least three pad units, in contact with the driver IC, are disposed adjacent to each other, and
wherein at least one wire unit, among a first wire unit connected to the first pad unit and a second wire unit connected to the second pad unit, is divided into at least two branches.

14. A driver IC film comprising:
a flexible film;
a plurality of driver ICs on a first surface of the flexible film;
a plurality of pad units, disposed on the first surface of the flexible film, corresponding to the plurality of driver ICs, respectively; and
a plurality of wire units extended from the plurality of pad units;
wherein at least one wire unit among the plurality of wire units is extended to a second surface opposite to the first surface by a via hole passing through the flexible film,
wherein the at least one wire unit extended by the via hole is further extended over a reference cut line so as to be connected to a test pad unit disposed outside the reference cut line, and
wherein the test pad unit is disposed between the plurality of driver ICs.

15. The driver IC film of claim 14, wherein at least one wire unit among the plurality of wire units is divided into at least two branches for the test pad unit for testing line defect inspection.

* * * * *